(12) United States Patent
Hu et al.

(10) Patent No.: US 11,121,299 B2
(45) Date of Patent: Sep. 14, 2021

(54) SEMICONDUCTOR DEVICE AND METHOD

(71) Applicant: Taiwan Semiconductor Manufacturing Company, Ltd., Hsinchu (TW)

(72) Inventors: Tian Hu, Hsinchu (TW); Yu-Hsiang Hu, Hsinchu (TW); Hung-Jui Kuo, Hsinchu (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/564,153

(22) Filed: Sep. 9, 2019

(65) Prior Publication Data

US 2020/0135997 A1    Apr. 30, 2020

Related U.S. Application Data

(60) Provisional application No. 62/753,755, filed on Oct. 31, 2018.

(51) Int. Cl.
*H01L 33/62*     (2010.01)
*H01L 33/00*     (2010.01)
(Continued)

(52) U.S. Cl.
CPC .......... *H01L 33/62* (2013.01); *H01L 25/0753* (2013.01); *H01L 33/0062* (2013.01);
(Continued)

(58) Field of Classification Search
CPC . H01L 33/62; H01L 33/0093; H01L 33/0062; H01L 33/10; H01L 33/24;
(Continued)

(56) References Cited

U.S. PATENT DOCUMENTS 5,406,095 A * 4/1995 Koyama ............... H01L 27/153
                                                        257/103
2005/0013334 A1* 1/2005 Watanabe ........... H01S 5/18311
                                                        372/44.01
(Continued)

FOREIGN PATENT DOCUMENTS

CN     102738193 A    10/2012
CN     107611127 A    1/2018
(Continued)

*Primary Examiner* — Galina G Yushina
(74) *Attorney, Agent, or Firm* — Slater Matsil, LLP

(57) ABSTRACT

A method includes depositing a photonic structure over a substrate, the photonic structure including photonic semiconductor layer, forming conductive pads over the photonic structure, forming a hard mask over the conductive pads, wherein the hard mask is patterned to cover each conductive pad with a hard mask region, etching the photonic structure using the hard mask as an etching mask to form multiple mesa structures protruding from the substrate, each mesa structure including a portion of the photonic structure, a contact pad, and a hard mask region, depositing a first photoresist over the multiple mesa structures, depositing a second photoresist over the first photoresist, patterning the second photoresist to expose the hard mask regions of the multiple mesa structures, and etching the hard mask regions to expose portions of the contact pads of the multiple mesa structures.

20 Claims, 45 Drawing Sheets

(51) Int. Cl.
*H01L 33/10* (2010.01)
*H01L 33/38* (2010.01)
*H01L 33/44* (2010.01)
*H01S 5/042* (2006.01)
*H01S 5/22* (2006.01)
*H01S 5/125* (2006.01)
*H01S 5/0234* (2021.01)
*H01L 33/24* (2010.01)
*H01S 5/40* (2006.01)
*H01L 25/075* (2006.01)
*H01S 5/0237* (2021.01)

(52) U.S. Cl.
CPC .......... *H01L 33/0093* (2020.05); *H01L 33/10* (2013.01); *H01L 33/24* (2013.01); *H01L 33/38* (2013.01); *H01L 33/44* (2013.01); *H01S 5/0234* (2021.01); *H01S 5/0237* (2021.01); *H01S 5/04254* (2019.08); *H01S 5/125* (2013.01); *H01S 5/22* (2013.01); *H01S 5/4025* (2013.01); *H01L 2933/0016* (2013.01); *H01L 2933/0025* (2013.01); *H01L 2933/0066* (2013.01)

(58) Field of Classification Search
CPC ..... H01L 33/46; H01L 33/44; H01L 25/0753; H01L 27/153; H01L 2933/0066; H01L 2933/0025; H01S 5/0234; H01S 5/0237; H01S 5/04254; H01S 5/22; H01S 5/125; H01S 5/4035
See application file for complete search history.

(56) References Cited

U.S. PATENT DOCUMENTS

| | | | |
|---|---|---|---|
| 2009/0161713 A1* | 6/2009 | Duggan | H01S 5/18394 372/45.01 |
| 2011/0116147 A1* | 5/2011 | Motomura | H01S 5/04254 359/204.1 |
| 2012/0241786 A1* | 9/2012 | Odnoblyudov | H01L 33/0095 257/98 |
| 2012/0256187 A1 | 10/2012 | Yu et al. | |
| 2012/0273823 A1 | 11/2012 | Yoneda et al. | |
| 2013/0020589 A1* | 1/2013 | Yu | H01L 33/502 257/88 |
| 2014/0339587 A1* | 11/2014 | Kawaguchi | H01L 33/36 257/98 |
| 2018/0053742 A1 | 2/2018 | Ting et al. | |

FOREIGN PATENT DOCUMENTS

| | | | |
|---|---|---|---|
| CN | 107768487 A | 3/2018 | |
| CN | 108572513 A | 9/2018 | |
| JP | H11177177 A | 7/1999 | |
| JP | 2014241401 A | 12/2014 | |
| KR | 100776165 * | 11/2007 | ........... H01L 21/027 |
| KR | 100776165 B1 | 11/2007 | |
| KR | 20080049705 A | 6/2008 | |
| KR | 20120121857 A | 11/2012 | |
| WO | 2006131316 A1 | 12/2006 | |

* cited by examiner

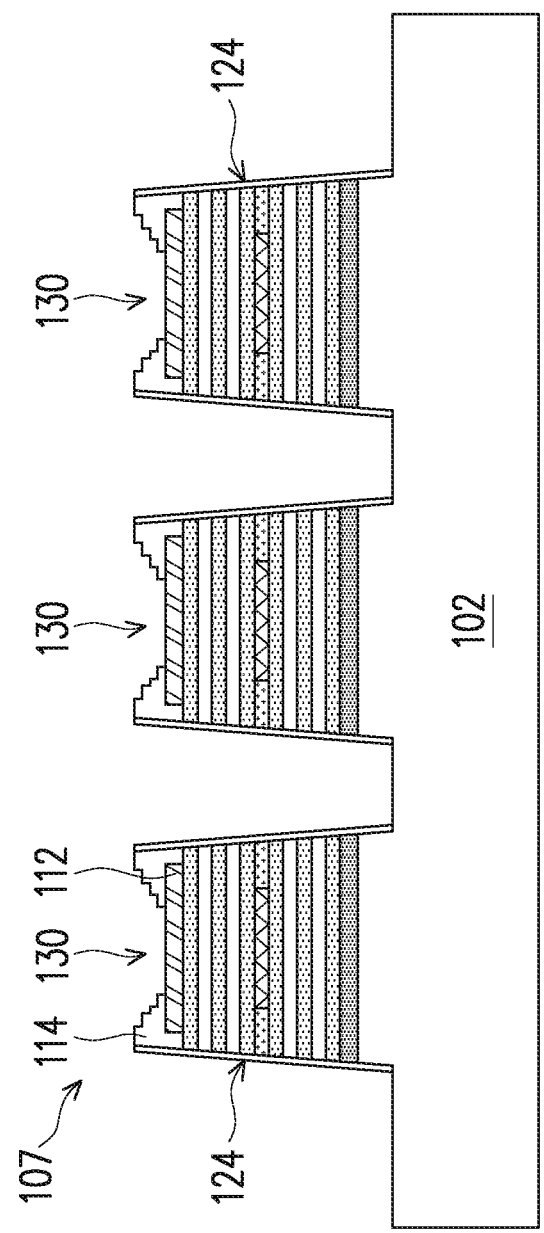

SEMICONDUCTOR DEVICE AND METHOD

PRIORITY CLAIM AND CROSS-REFERENCE

This application claims priority to U.S. Provisional Patent Application No. 62/753,755 filed Oct. 31, 2018, entitled "Semiconductor Device and Method," which application is hereby incorporated by reference in its entirety.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. Optical features have been integrated with semiconductor devices in increasingly more applications in recent years, particularly due to the rising demand for cameras in phones, tablets, and other portable devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9A through 9F illustrate various cross-sectional views of a process for forming recesses in mesas of a photonic structure, in accordance with a fourth embodiment.

DETAILED DESCRIPTION

Figure 1:
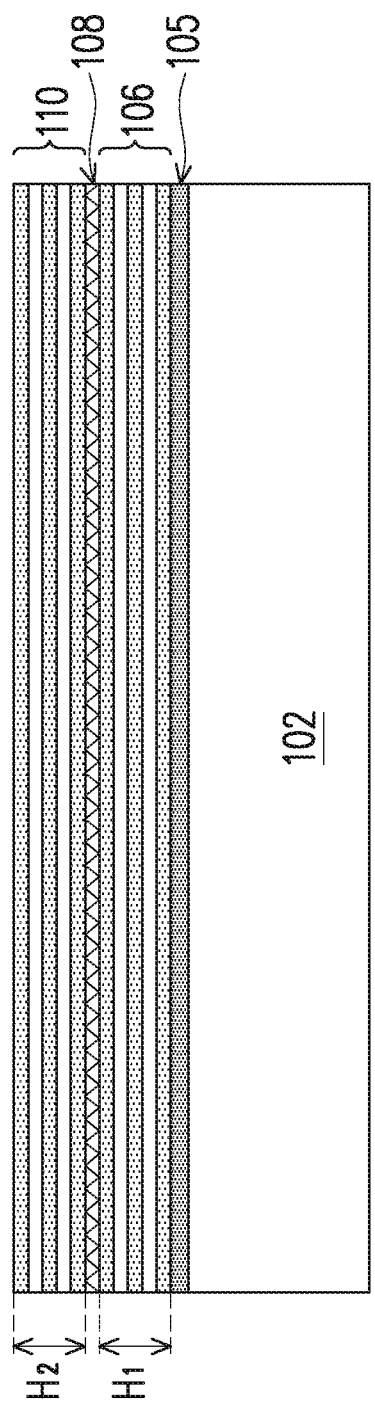
FIGS. 1 through 5 illustrate various cross-sectional views of a process for forming a photonic structure, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a photonic device such as a light-emitting diode device or a laser device is formed. The photonic device may include a first structure that includes multiple mesas protruding from a carrier substrate. A hard mask material may be formed over top surfaces of the mesas, and then recesses formed in the hard mask material that are used for subsequent bonding pad formation. In some embodiments, the recesses are formed in the hard mask material by depositing a first photoresist in a first step, depositing a second photoresist over the first photoresist in a second step, and then patterning the second photoresist. In some embodiments, the first photoresist is also patterned. The patterned second photoresist may be used as an etching mask for etching the recesses in the hard mask material. The use of both a first photoresist and a second photoresist can allow for improved photoresist patterning over the mesas, and thus reduce the chance of defects due to improperly etched recesses in the hard mask material. In some embodiments, the hard mask material is etched using multiple etch steps that partially etch the hard mask material and trim steps that partially etch the second photoresist. In this manner, the recesses may be formed having less vertical sidewalls, such as sidewalls having a stepped profile. In this manner, bonding pads formed over the recesses can have a shape with less vertical sidewalls, which can allow for improved solder contact during bonding.

FIGS. 1-5, 6A-J, 7A-F, 8A-F, 9A-F, and 10 illustrate various cross-sectional view of a process for forming a structure comprising light-emitting diodes, in accordance with some embodiments. FIGS. 1-5 illustrate various steps in forming an initial device, and FIGS. 6A-K, FIGS. 7A-F, FIGS. 8A-F, and FIGS. 9A-F illustrate four separate embodiment processes for forming openings 130 (see FIG. 5) in the hard mask 114 (see FIG. 5) subsequent to the process shown in FIGS. 1-5. FIG. 10 illustrates formation of bonding pads 116 subsequent to any of the four separate embodiment processes shown in FIGS. 6A-J, FIGS. 7A-F, FIGS. 8A-F, and FIGS. 9A-F. While the processes and structures are described in the particular context of forming structures including light-emitting diodes, the formation of other structures such as semiconductor lasers, photodetectors, or other photonic devices are also considered within the context of this disclosure.

In FIG. 1, a carrier substrate 102 is provided. The carrier substrate 102 may be a semiconductor substrate, such as a bulk semiconductor, a semiconductor-on-insulator (SOI)

substrate, or the like, which may be doped (e.g., with a p-type or n-type dopant) or undoped. The carrier substrate 102 may be a wafer, such as a silicon wafer or a gallium arsenide (GaAs) wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the carrier substrate 102 may include a semiconductor including silicon or germanium, a compound semiconductor including silicon carbide, gallium arsenide, gallium phosphide, indium phosphide, indium arsenide, or indium antimonide, other semiconductors including SiGe, GaAsP, AlInAs, AlGaAs, GaInAs, GaInP, or GaInAsP, the like, or combinations thereof.

An etch stop layer 105 may be formed on the carrier substrate 102. The etch stop layer 105 may be deposited by a suitable deposition process, such as chemical vapor deposition (CVD), or may be grown by a suitable epitaxy process. The etch stop layer 105 may include materials such as InGaP, InP, GaAsAl, AlAs, the like, or a combination thereof that exhibits a sufficient etch rate selectivity as compared to subsequently formed overlying layers. In some embodiments, the etch stop layer 105 has a thickness between about 0.1 μm and about 5 μm.

A first reflective structure 106 may be formed on the etch stop layer 105. The first reflective structure 106 may include multiple layers of materials, such as one or more types of semiconductive materials. The layers may be doped or undoped. The layers may be deposited by a suitable deposition process, such as chemical vapor deposition (CVD), or may be grown by a suitable epitaxy process. The first reflective structure 106 may be, for example, a distributed Bragg reflector structure, in which alternating layers of materials having different refractive indices are used in combination to reflect light and/or transmit light of particular wavelengths. In some embodiments, the reflective structure 106 includes alternating layers of different materials, such as alternating layers of semiconductor materials with different compositions. In some embodiments, the first reflective structure 106 includes alternating doped and undoped layers of the material of the carrier substrate 102 (e.g., GaAs), with the doped layers having different refractive indices than the undoped layers. The dopant may be any suitable dopant that allows the doped layers to have different refractive indices than the undoped layers. In some embodiments, the dopant is a p-type dopant such as C. In some embodiments, the doped layers of the first reflective structure 106 have a dopant concentration in the range of from about 1E-17 atoms/cm$^3$ to about 1E-18 atoms/cm$^3$. The first reflective structure 106 may thus form p-type reflecting regions in the resulting light emitting diodes 104 (see FIG. 10). The first reflective structure 106 may have any width. In some embodiments, the first reflective structure 106 has a height $H_1$ between about 1 μm and about 9 μm. FIG. 1 illustrates four alternating layers for illustrative purposes, and other embodiments may have fewer or more alternating layers.

Sill referring to FIG. 1, a photonic semiconductor region 108 is formed on the first reflective structure 106. The photonic semiconductor region 108 may include a doped layer of the material of the carrier substrate 102 (e.g., GaAs), or may include other materials or combinations of materials. In some embodiments, the photonic semiconductor region 108 may have a p-type region and an n-type region. In some embodiments, the photonic semiconductor region 108 includes a P-N junction that emits light during operation (e.g., as a light emitting diode) or that lases at a single resonant frequency during operation. The p-type region may be doped with p-type dopants such as boron, aluminum, gallium, indium, and the like, and the n-type region may be doped with n-type dopants such as phosphorus, arsenic, and the like. In some embodiments, the p-type region is formed over the n-type region. The n-type region of the photonic semiconductor region 108 may be connected to the first reflective structure 106 such that light emits towards the first reflective structure 106. In other embodiments, the photonic semiconductor region 108 is used as part of a photodetector.

A second reflective structure 110 may be formed on the photonic semiconductor region 108. The p-type region of the photonic semiconductor region 108 may be connected to the second reflective structure 110. The second reflective structure 110 may include multiple layers of materials, such one or more semiconductive materials. In some embodiments, the second reflective structure 110 includes alternating layers of different materials, such as alternating layers of semiconductor materials with different compositions. The layers may be doped or undoped. The layers may be deposited by a suitable deposition process, such as chemical vapor deposition (CVD), or may be grown by a suitable epitaxy process. The second reflective structure 110 may be, for example, a distributed Bragg reflector. In some embodiments, the second reflective structure 110 comprises alternating doped and undoped layers of the material of the carrier substrate 102 (e.g., GaAs), with the doped layers having different refractive indices than the undoped layers. The dopant may be any dopant that allows the doped layers to have different refractive indices than the undoped layers. In some embodiments, the dopant is an n-type dopant such as Si. In some embodiments, the doped layers of the second reflective structure 110 have a dopant concentration in the range of from about 1E-17 atoms/cm$^3$ to about 1E-18 atoms/cm$^3$. The second reflective structure 110 may thus form n-type reflecting regions in the resulting light emitting diodes 104 (see FIG. 3). The dopant of the second reflective structure 110 may be a different dopant than the dopant of the first reflective structure 106. In some embodiments, the second reflective structure 110 has a height $H_2$ between about 1 μm and about 9 μm. FIG. 1 illustrates four alternating layers for illustrative purposes, and other embodiments may have fewer or more alternating layers.

In some embodiments, the reflective structures 106 and 110 form a resonant cavity, which can enhance the intensity of light from the photonic semiconductor region 108. The reflective structures 106 and 110 may have different reflectivities at the same wavelengths of light. For example, the refractive indices of the reflective structures 106 and 110 may be different at a particular wavelength of light, such as a wavelength of light emitted from the photonic semiconductor region 108 during operation. In some embodiments, the first reflective structure 106 is formed to have a lower reflectivity than the second reflective structure 110, to allow for more emission of light (e.g., laser light) from the photonic semiconductor region 108 to be transmitted through the first reflective structure 106 than through the second reflective structure 110. In some cases, the refractive indices of the reflective structures 106 and 110 may be varied by adjusting the overall heights, numbers of alternating layers, or overall doping amounts of the reflective structures 106 and 110. For example, a first reflective structure 106 having fewer alternating layers than a second reflective structure 110 may have a lower reflectivity than the second reflective structure 110. In some embodiments, the height $H_1$ of the first reflective structure 106 may be less than the height $H_2$ of the second reflective structure 110, for example, due to the first reflective structure 106 having fewer alternating layers than the second reflective structure 110.

Figure 2:
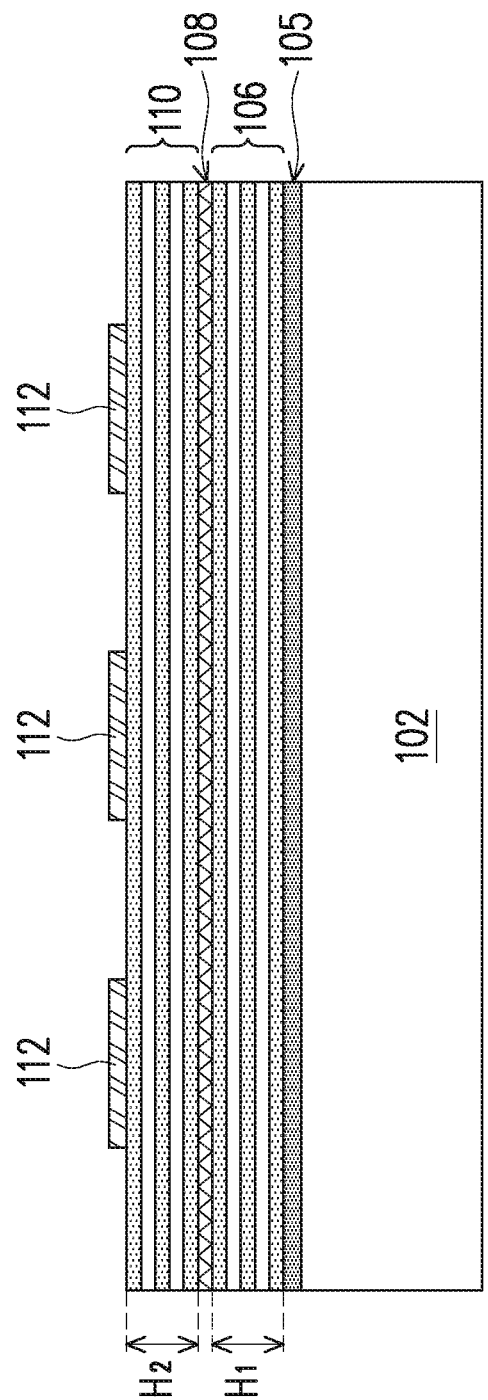

In FIG. 2, contact pads 112 are formed on the second reflective structure 110. The contact pads 112 are physically and electrically connected to the second reflective structure 110, which itself is physically and electrically connected to the photonic semiconductor region 108. The contact pads 112 thus electrically connect to the n-type side of the resulting light emitting diodes 104 (see FIG. 10). The contact pads 112 may include one or more materials such as Ge, Au, GeAu, Ni, Ti, Ta, Pt, Cu, Pt, Al, W, In, Ag, Sn, Zn, Pd, Mn, Sb, Be, Mg, Si, the like, or a combination. The contact pads 112 may include a single layer of material or multiple layers of materials. In some embodiments, the contact pads 112 form an ohmic electrical contact with the second reflective structure 110.

In some embodiments, the contact pads 112 are formed by first forming a seed layer over the second reflective structure 110. In some embodiments, the seed layer is a metal layer, which may be a single layer or a composite layer including multiple sub-layers formed of different materials. In some embodiments, the seed layer includes layer of copper over a layer of titanium. The seed layer may be formed using, for example, physical vapor deposition (PVD) or the like. A photoresist may then be formed over the seed layer and patterned. The photoresist may be formed by spin-coating or the like and may be patterned using suitable photolithography techniques (e.g., exposure to light followed by photoresist etching). The pattern of the photoresist corresponds to the contact pads 112. The patterning forms openings through the photoresist that expose the seed layer. A conductive material is then formed in the openings of the photoresist and on the exposed portions of the seed layer. The conductive material may be formed by plating, such as electroplating, electroless plating, or the like. The conductive material may include a metal, like copper, titanium, tungsten, aluminum, the like, or a combination. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the contact pads 112.

Figure 3:
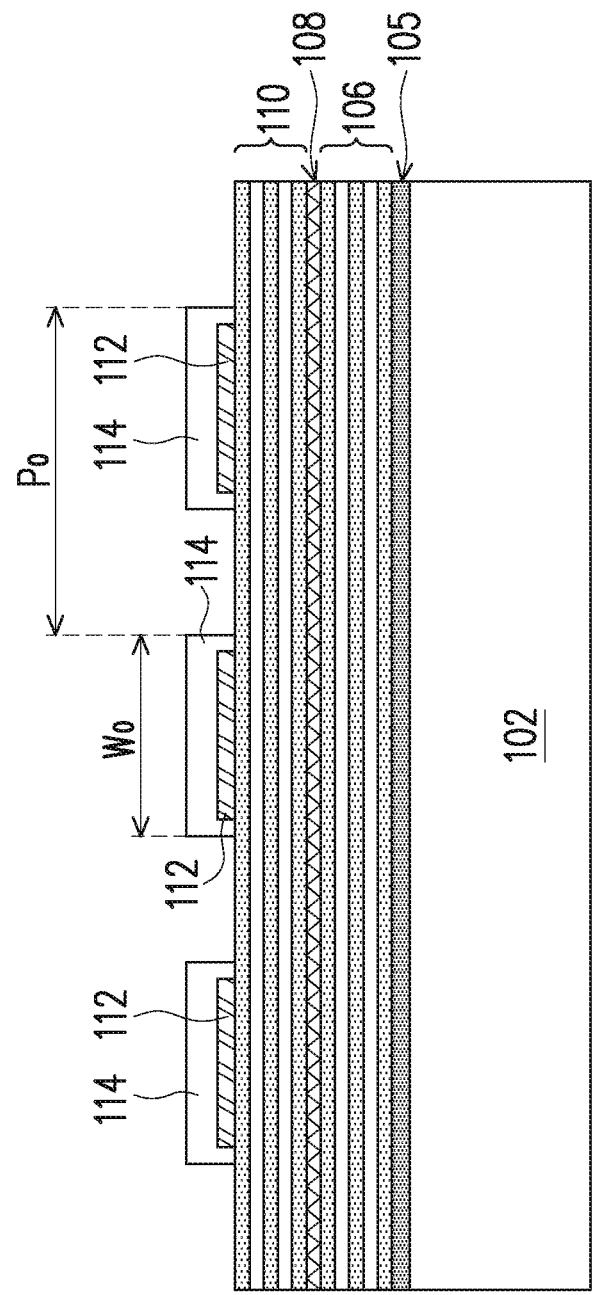

Turning to FIG. 3, a hard mask material is formed over the second reflective structure 110 and the contact pads 112 and then patterned, forming hard mask regions 114. The hard mask material is patterned such that the hard mask regions 114 cover the contact pads 112, and portions of the second reflective structure 110 are exposed between hard mask regions 114. The hard mask material of the hard mask regions 114 may be a material, such as silicon oxide, silicon nitride, aluminum oxide, the like, or a combination, having a sufficient etch selectivity as compared to the materials of the second reflective structure 110, the photonic semiconductor region 108, and the first reflective structure 106 to allow the hard mask regions 114 to be used as a mask. The hard mask material may be formed by a deposition process such as CVD, the like, or another suitable process. The hard mask material may be patterned into hard mask regions 114 by any suitable photolithographic mask and etching process. For example, a photoresist may be formed over the second reflective structure 110 and over the contact pads 112. The photoresist may then be patterned, and one or more etching processes (e.g., dry etch processes) may be utilized to remove portions of the hard mask material, leaving remaining portions of the hard mask material where hard mask regions 114 are desired. The photoresist may then be removed using a suitable process, such as an ashing process. In some embodiments, the hard mask regions 114 may be formed having a thickness on the second reflective structure 10 between about 1 μm and about 5 μm and having a thickness on the contact pads 112 between about 0.8 μm and about 0.2 μm. In some embodiments, the hard mask regions 114 may be patterned having a width $W_0$ between about 3 μm and about 50 μm and having a pitch P between about 6 μm and about 100 μm, such as about 20 μm. In some embodiments, the width $W_0$ or the pitch $P_0$ of the hard mask regions 114 may be determined to subsequently form mesas 107 having a particular width $W_1$ or pitch $P_1$ (see FIG. 5).

Figure 4:
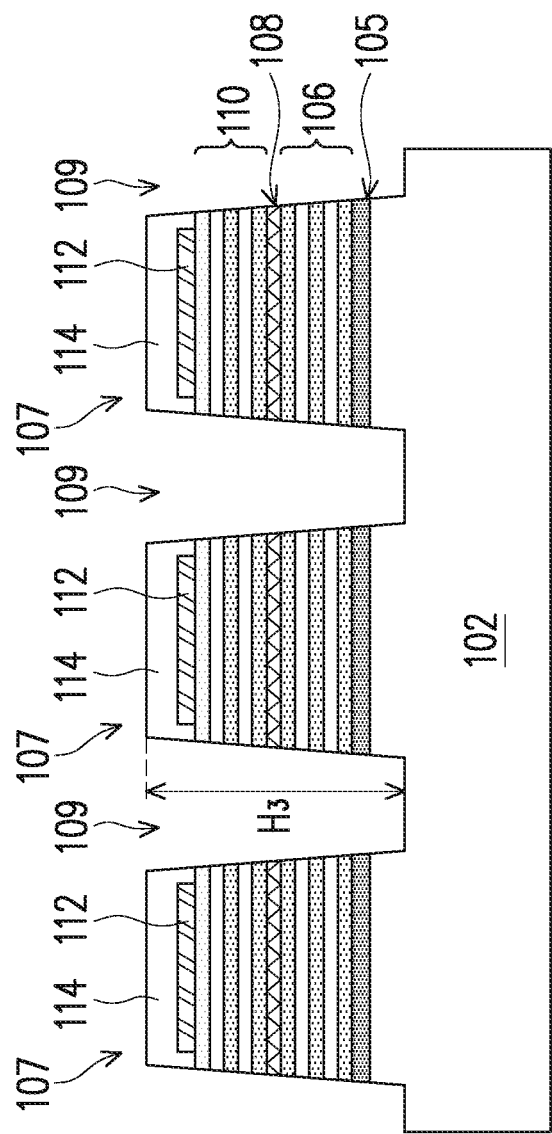

Turning to FIG. 4, recesses 109 are formed in the second reflective structure 110, the emitting semiconductor region 108, the first reflective structure 106, and the carrier substrate 102. The recesses 109 are formed using one or more etching processes using the hard mask regions 114 as an etching mask. Remaining portions of the second reflective structure 110, the emitting semiconductor region 108, the first reflective structure 106, and the carrier substrate 102 define multiple mesas 107. The recesses 109 may be etched using one or more wet etching processes or using one or more anisotropic dry etching processes. In some embodiments, the recesses 109 may be etched using multiple different dry etching processes. In some embodiments, the mesas 107 may have straight sidewalls, curved sidewalls, vertical sidewalls, tapered sidewalls, stepped sidewalls, or sidewalls having a combination of these characteristics. In some embodiments, the sidewalls of the mesas 107 may have multiple straight or tapered portions having different angles with respect to each other. For example, in some embodiments, a first portion of the mesas 107 (e.g., a lower portion) may have more vertical sidewalls than a second portion (e.g., an upper portion) of the mesas 107. In some embodiments, in a plan view, the mesas 107 may have a square shape, a rectangular shape, a circular shape, an irregular shape, an elongated shape (e.g., a strip), or have another shape.

In some embodiments, the dry etching process includes a plasma etching process performed in a processing chamber with process gases being supplied into the processing chamber. In some embodiments, the plasma is a direct plasma. In other embodiments, the plasma is a remote plasma that is generated in a separate plasma generation chamber connected to the processing chamber. Process gases may be activated into plasma by any suitable method of generating the plasma, such as transformer coupled plasma (TCP) systems, inductively coupled plasma (ICP) systems, magnetically enhanced reactive ion techniques, electron cyclotron resonance techniques, or the like.

In some embodiments, the process gases used in the dry etching process may be flowed into the processing chamber at a rate between about 10 sccm and about 1000 sccm. In some embodiments, the dry etching process is performed at a temperature between about 25° C. and about 100° C. A pressure in the processing chamber may be between about 1 mTorr and about 200 mTorr. In some embodiments, the process characteristics of the dry etching process may be changed one or more times during etching, which may cause the sidewalls of the mesas 107 to have a stepped profile or a profile having multiple portions, as described above.

Figure 5:
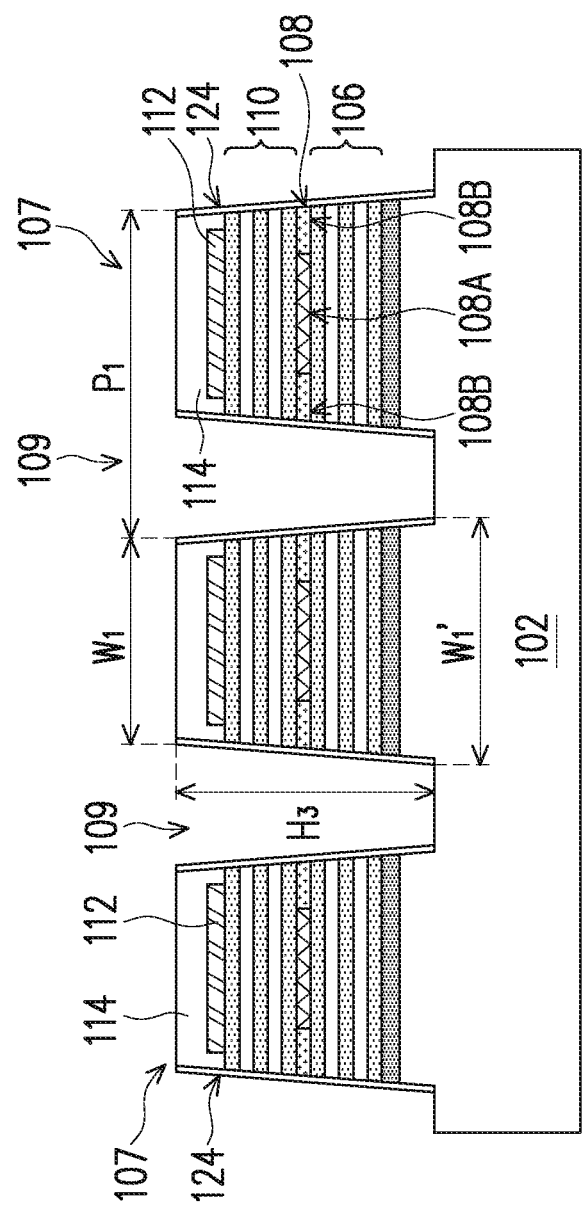

Still referring to FIG. 4, in some embodiments, the recesses 109 are etched into the carrier substrate 102 such that the mesas 107 have a height $H_3$ between about 5 μm and about 25 μm. The mesas 107 may have vertical sidewalls or may have tapered sidewalls, as shown in FIG. 5. The mesas 107 may also have sidewalls with both vertical portions and tapered portions. In some embodiments, a cleaning process such as a wet chemical clean or a dry plasma cleaning process may be performed after etching the recesses 109.

Turning to FIG. 5, opaque portions 108B are formed in the photonic semiconductor regions 108 of the mesas 107. The opaque portions 108B extend around the perimeter of transparent portions 108A of the photonic semiconductor regions 108 in a top-down view. In some embodiments, the opaque portions 108B substantially block or absorb light from the photonic semiconductor region 108, such that the light is not emitted from the resulting light emitting diodes 104 in lateral direction (e.g., in a direction parallel to a major surface of the carrier substrate 102). The opaque portions 108B may also be less conductive to carriers than the transparent portions 108A, and thus may increase the carrier concentration of the more conductive transparent portions 108A during operation. The opaque portions 108B may include oxidized material of the photonic semiconductor regions 108. In some embodiments, the opaque portions 108B are formed from the material of the photonic semiconductor region 108 by an oxidation process such as a rapid thermal oxidation (RTO) process, a wet chemical oxidation process, a rapid thermal anneal (RTA) performed in an oxygen-containing environment, or the like.

Still referring to FIG. 5, protective spacers 124 are formed on sides of the mesas 107. The protective spacers 124 may be formed from a dielectric material such as silicon nitride, silicon oxide, SiCN, aluminum oxide, a combination thereof, or the like. The protective spacers 124 may be formed by a conformal deposition using CVD, PVD, ALD, or the like, followed by an anisotropic dry etch to remove portions of the protective spacers on lateral surfaces of the carrier substrate 102 or hard mask regions 114. In some embodiments, the protective spacers 124 are formed having a thickness of between about 0.05 μm and about 3 μm.

For clarity, references to the mesas 107 are hereinafter considered to also include the protective spacers 124. After formation of the protective spacers 124, the mesas 107 may be spaced apart a pitch $P_1$. In some embodiments, the pitch $P_1$ is between about 6 μm and about 100 μm. In some embodiments, lower portions of the first reflective structures 106 have a lower width $W_1'$, and upper portions of the second reflective structures 110 have an upper width $W_1$. In some embodiments, the lower width $W_1'$ is between about 4 μm and about 51 μm, and the upper width $W_1$ is between about 3 μm and about 50 μm. In some embodiments, the mesas 107 may have an aspect ratio (height/width) between about 0.1 and about 9, such as about 1.1. In some embodiments, the recesses 109 between adjacent mesas 107 may have an aspect ratio (height/width) between about 0.1 and about 9.

FIGS. 6A-K, FIGS. 7A-F, FIGS. 8A-F, and FIGS. 9A-F illustrate four embodiment processes for forming openings 130 in the hard mask regions 114 subsequent to the process shown in FIGS. 1-5. FIGS. 6A-K illustrate intermediate process steps for forming recesses 130 (see FIG. 6J) in the hard mask regions 114, according to a first embodiment. In the embodiment shown in FIGS. 6A-K, a negative photoresist 600 is formed and patterned (see FIGS. 6A-C), and then a positive photoresist 610 is formed over the negative photoresist 600 and patterned to form an etching mask (see FIGS. 6D-F). Then, using the patterned positive photoresist 610 as an etching mask, an etching process using cycles of etch steps and trim steps is used to form the recesses 130 in the hard mask regions 114 (see FIGS. 6G-K).

In some cases, forming the negative photoresist 600 and then the positive photoresist 610 over the negative photoresist 600 may reduce the chance of defects due to improper photoresist patterning. For example, the use of two photoresists may reduce the chance that all of the photoresist over the hard mask regions 114 is removed during development. If all of the photoresist over the hard mask regions 114 is removed, a greater amount of the material of the hard mask regions 114 may be removed than desired during formation of the recesses 130 (see FIGS. 6G-J). Improper etching of the hard mask regions 114 can cause a device to fail or have reduced performance. In some cases, the use of two photoresists as described can reduce improper photoresist patterning for mesas 107 having a relatively large pitch (e.g., greater than about 20 μm) or adjacent mesas 107 separated by a gap with a relatively large aspect ratio (e.g., having a gap height/width less than about 4). In this manner, the formation of both the negative photoresist 600 and the positive photoresist 610 as described can reduce the chance of process defects and also provide more flexibility in the design of devices.

Figure 6A:
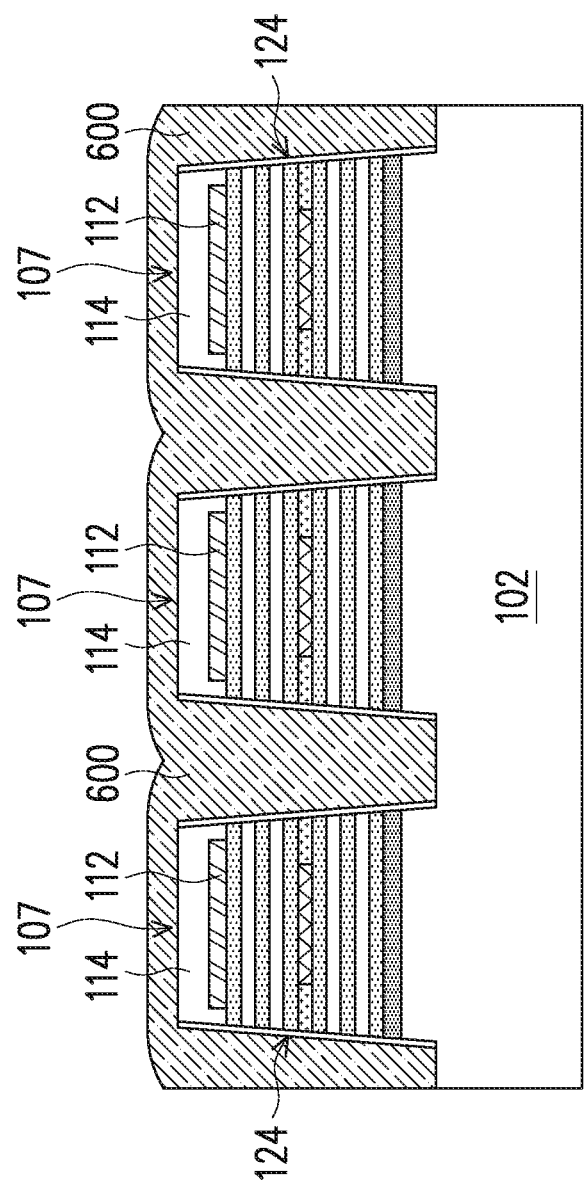
FIGS. 6A through 6K illustrate various cross-sectional views of a process for forming recesses in mesas of a photonic structure, in accordance with a first embodiment.

Turning first to FIG. 6A, the negative photoresist 600 is formed over the mesas 107 and the carrier substrate 102. The negative photoresist 600 fills the recesses 109 and may cover top surfaces of the hard mask regions 114. The negative photoresist 600 may be formed by a suitable process such as spin-coating or the like. In some embodiments, the negative photoresist 600 may be formed having a thickness over top surfaces of the hard mask regions 114 between about 0 μm and about 1 μm.

Figure 6B:
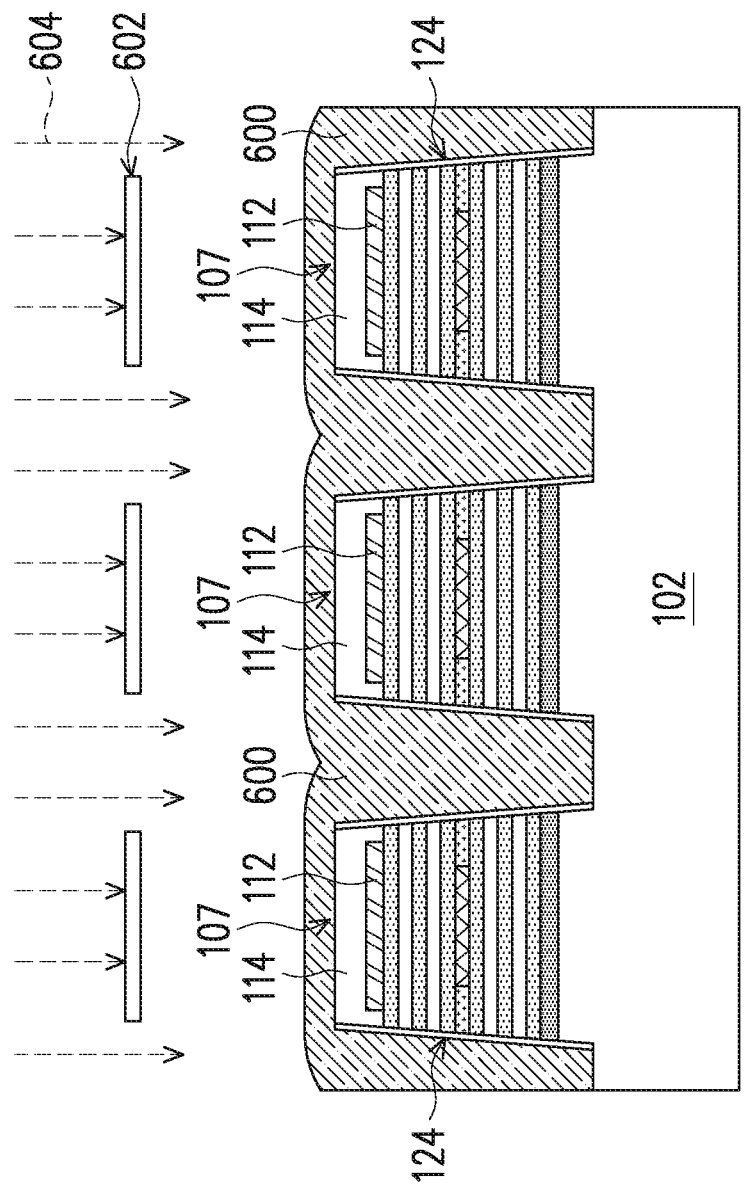

In FIG. 6B, the negative photoresist 600 is exposed to a light 604 using a photomask 602. The light 604 may be, for example, ultraviolet (UV) light. The photomask 602 may have a pattern such that only regions of the negative photoresist 600 disposed between mesas 107 are exposed to the light 604. Upon exposure to the light 604, the negative photoresist 604 in the exposed regions becomes crosslinked or polymerized and thus becomes more resistant to removal by a developer (see FIG. 6C).

Figure 6C:
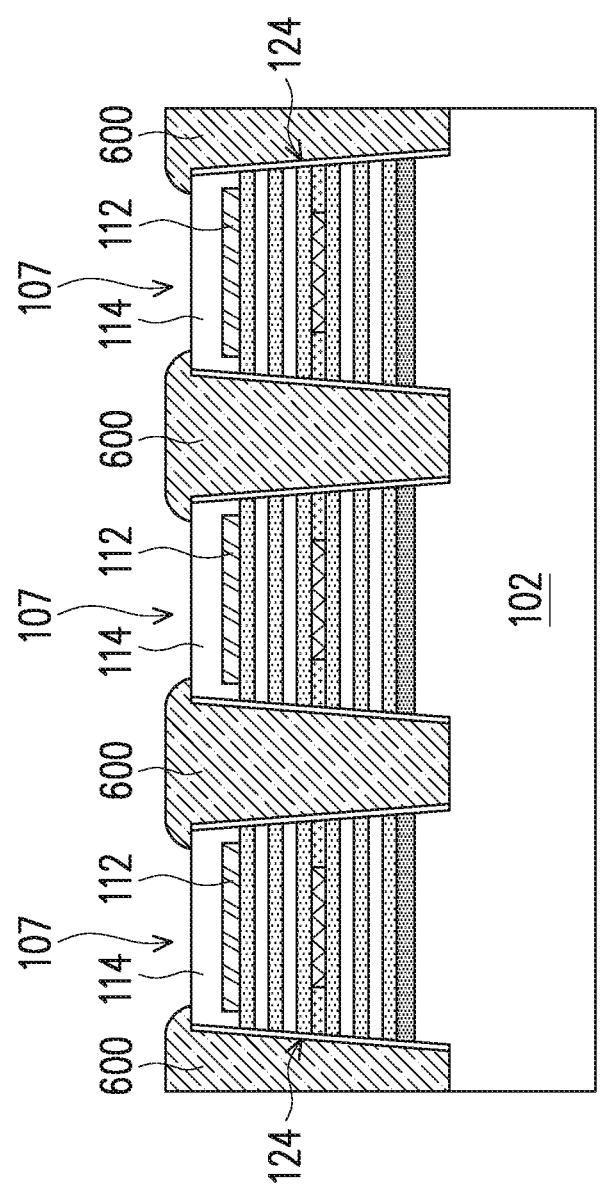

In FIG. 6C, the negative photoresist 600 is developed, removing portions of the negative photoresist 600 that were not exposed to the light 604. The negative photoresist 600 may be developed, for example, using a suitable wet chemical developer. In this manner, the negative photoresist 600 may be patterned. The remaining portions of the negative photoresist 600 are disposed between the mesas 107, and may protrude above top surfaces of the hard mask regions 114. In some embodiments, the remaining negative photoresist 600 extends partially over top surfaces of the hard mask regions 114. In some embodiments, the top surfaces of the hard mask regions 114 are free of remaining negative photoresist 600. In some embodiments, after developing the negative photoresist 600, a heat treatment process (e.g., a hard bake) is performed to increase the stability of the remaining negative photoresist 600. In some embodiments, the negative photoresist 600 protrudes above top surfaces of the hard mask regions 114 between about 0 μm and about 1 μm.

Figure 6D:
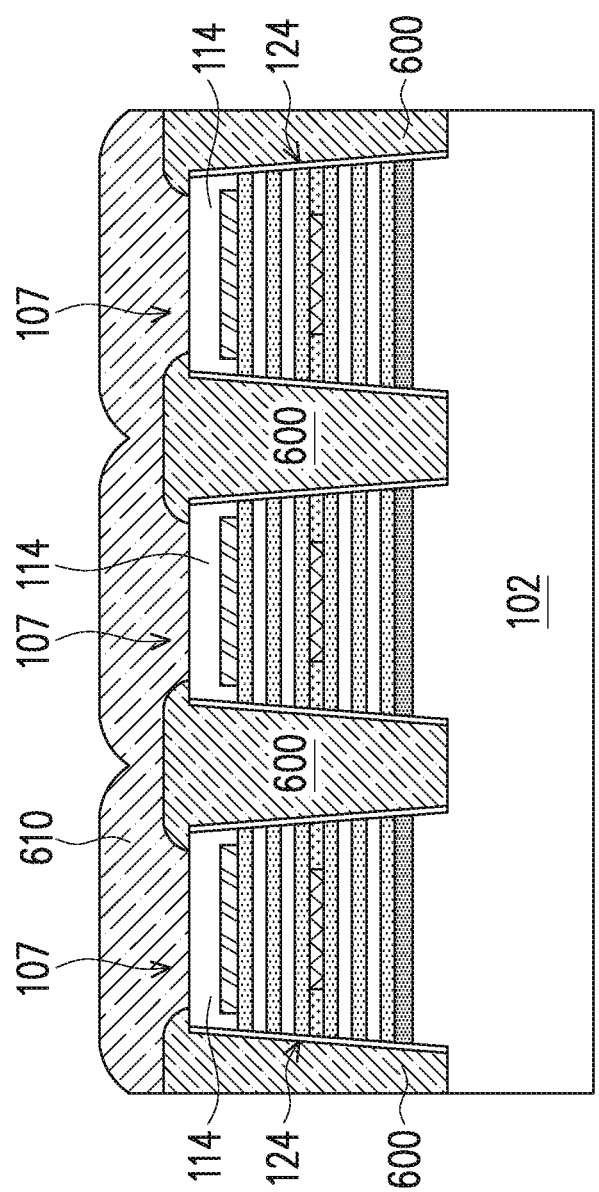

Turning to FIG. 6D, the positive photoresist 610 is formed over the mesas 107 and the negative photoresist 600. The positive photoresist 610 covers top surfaces of the hard mask regions 114. The positive photoresist 610 may be formed by a suitable process such as spin-coating or the like. In some embodiments, the positive photoresist 610 may have recessed regions (e.g., thinner regions) between the hard mask regions 114, as shown in FIG. 6D. In some cases, recessed regions of the positive photoresist 610 between the hard mask regions 114 may be due to the negative photoresist 600 incompletely filling the recesses 109. In some cases, the positive photoresist 610 may have recessed regions over the hard mask regions 114. In some cases, recessed regions of the positive photoresist 610 over the hard mask regions 114 may be due to the negative photoresist 610 protruding above the mesas 107. In some cases, the recessed regions of the positive photoresist 610 may be located between the hard mask regions 114 and the negative photoresist 600 may protrude above the mesas 107, as shown in FIG. 6D.

Figure 6E:
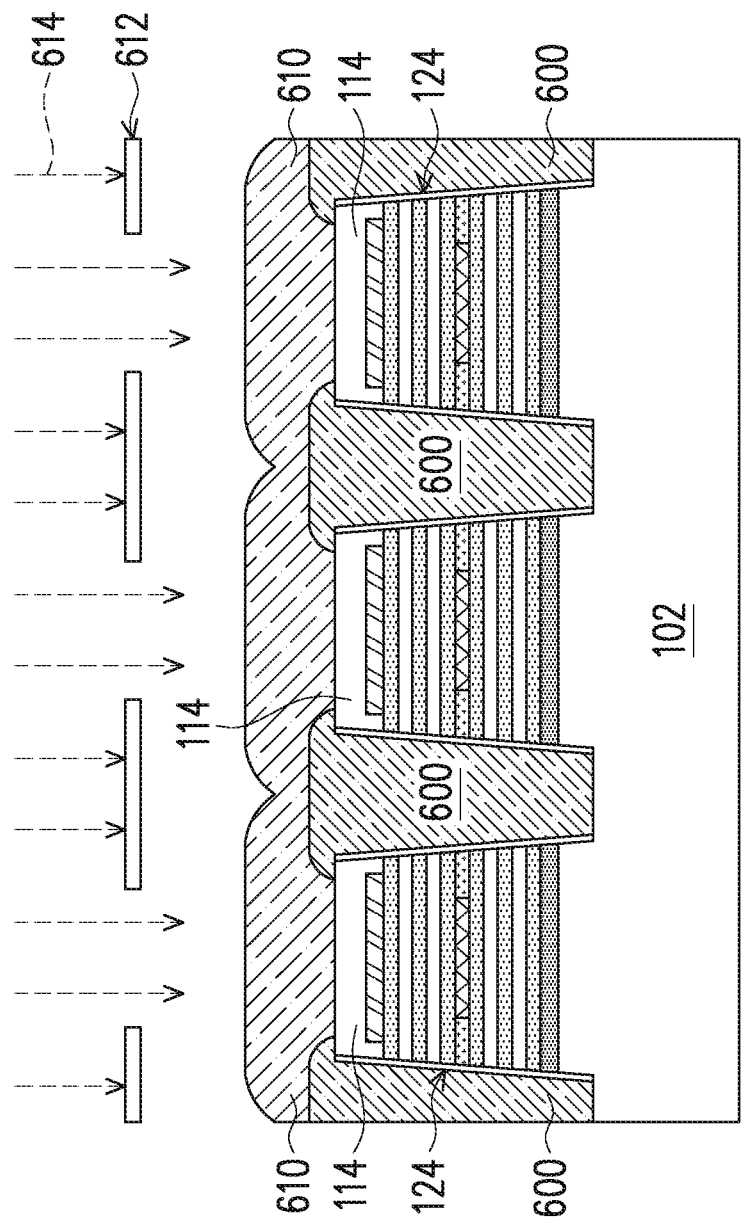

In FIG. 6E, the positive photoresist 610 is exposed to a light 614 using a photomask 612. The light 614 may be, for example, ultraviolet (UV) light. The photomask 612 may have a pattern such that only some regions of the positive photoresist 610 directly over the mesas 107 are exposed to the light 614. Upon exposure to the light 614, the positive photoresist 610 in the exposed regions becomes less resistant to removal by a developer (see FIG. 6F).

Figure 6F:
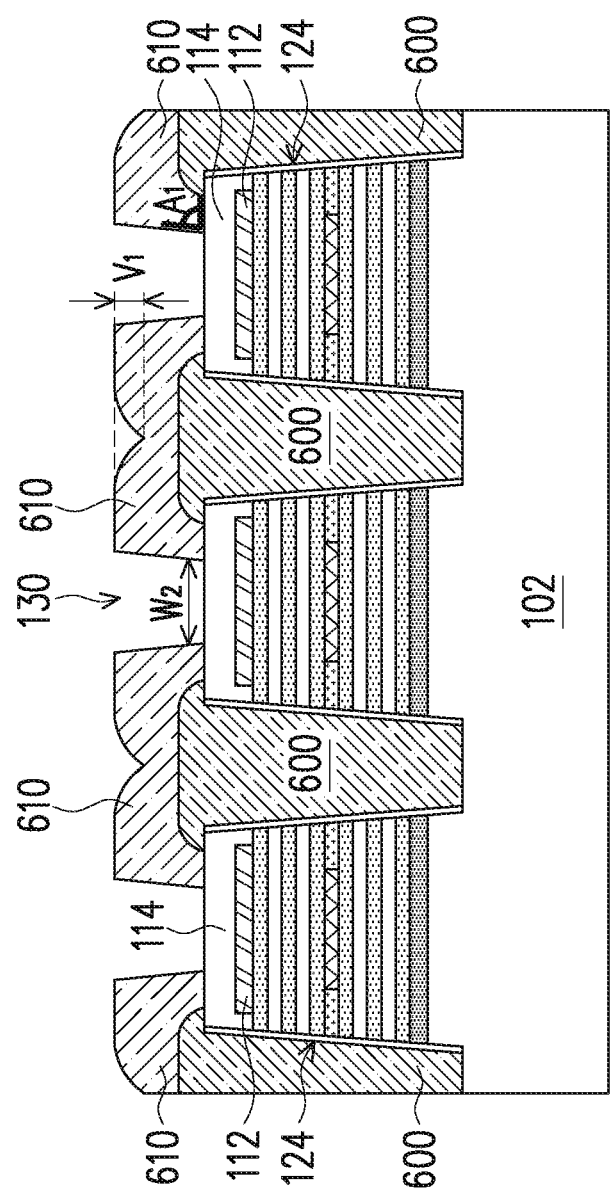
Figure 6G:
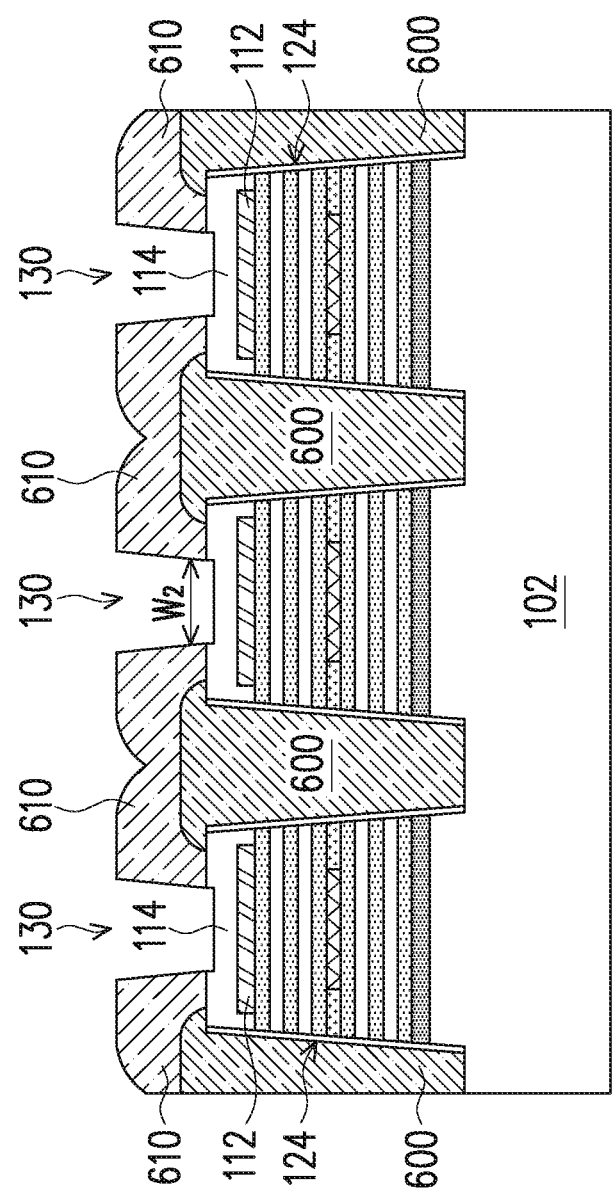

In FIG. 6F, the positive photoresist 610 is developed, removing portions of the positive photoresist 610 that were exposed to the light 614. The positive photoresist 610 may be developed, for example, using a suitable wet chemical developer. In this manner, the positive photoresist 610 may be patterned, exposing top surfaces of the hard mask regions 114. Some remaining portions of the positive photoresist 610 extend partially over top surfaces of the hard mask regions 114. In some embodiments, after developing the positive photoresist 610, a heat treatment process (e.g., a hard bake) is performed to increase the stability of the remaining positive photoresist 610. In some embodiments, the positive photoresist 610 protrudes above top surfaces of the hard mask regions 114 a thickness between about 3 µm and about 0 µm, such as about 1.5 µm.

Still referring to FIG. 6F, after developing the positive photoresist 610, openings in the positive photoresist 610 over the hard mask regions 114 may have a width $W_2$ between about 1 µm and about 12 µm. In some embodiments, the variation $V_1$ in the height of the positive photoresist 610 may be less than about 1 µm. In some embodiments, the openings in the positive photoresist 610 make an angle $A_1$ with a top surface of the hard mask regions 114 between about 30° and about 90°, such as about 46°.

In FIGS. 6G-J, recesses 130 are formed in the hard mask regions 114, exposing the contact pads 112. Initially, a first etching step is performed to partially etch the hard mask regions 114, using the positive photoresist 610 as an etching mask. In some embodiments, the first etching step may etch the hard mask regions 114 a depth between about 0.1 µm and about 0.5 µm. The first etching step may include, for example, a dry etching process. In some embodiments, the dry etching process includes a plasma etching process performed in a processing chamber with process gases being supplied into the processing chamber. In some embodiments, the plasma is a direct plasma. In other embodiments, the plasma is a remote plasma that is generated in a separate plasma generation chamber connected to the processing chamber. Process gases may be activated into plasma by any suitable method of generating the plasma, such as transformer coupled plasma (TCP) systems, inductively coupled plasma (ICP) systems, magnetically enhanced reactive ion techniques, electron cyclotron resonance techniques, or the like.

Figure 6H:
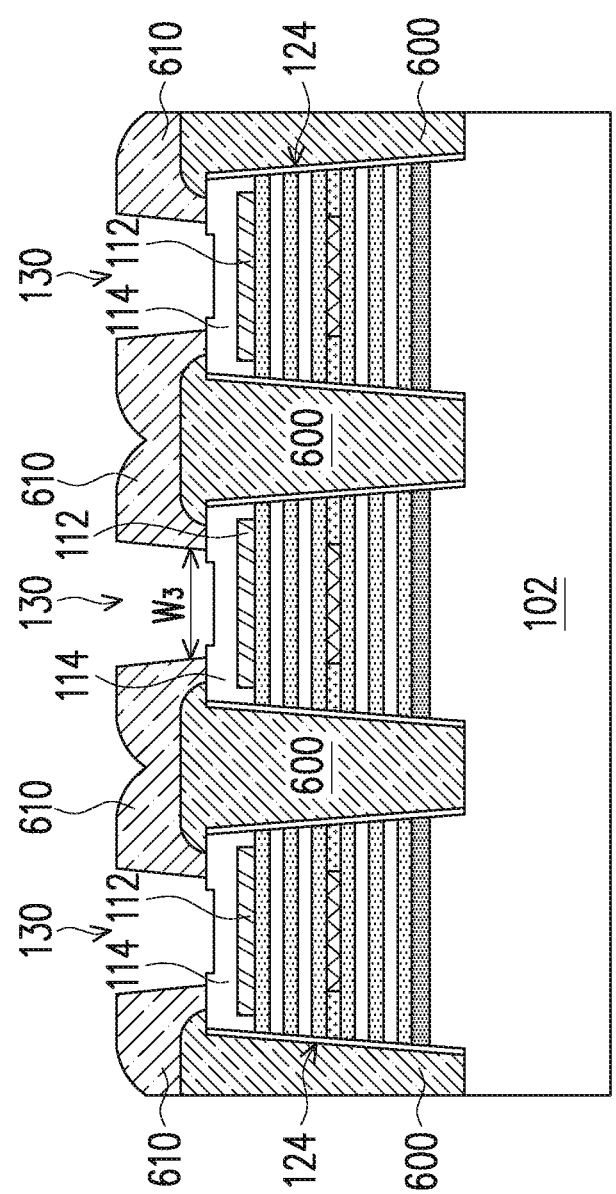

Turning to FIG. 6H, after the first etching step, a first trim step is performed. The first trim step etches the positive photoresist 610, which increases the width of the openings in the positive photoresist 610. For example, the first trim step may increase the width of the openings in the positive photoresist from $W_2$ (see FIG. 6G) to a width $W_3$, which may be between about 0.01 µm and about 1 µm larger than $W_2$. The first trim step may expose portions of the top surfaces of the hard mask regions 114. In some cases, a shallower angle $A_1$ of the positive photoresist 610 may allow for a larger increase of the width of the openings in the positive photoresist 610 due to the first trim step. In some embodiments, the first trim step includes a dry etching process, such as a plasma etching process, which may be performed in the same processing chamber as the first etching step.

Figure 6I:
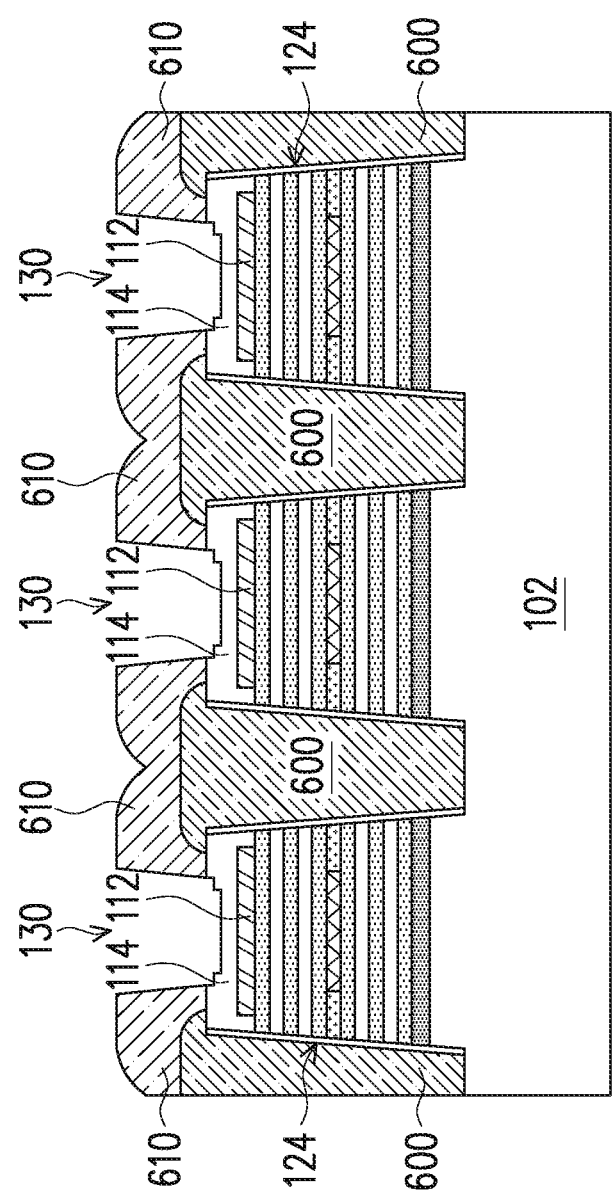

Turning to FIG. 6I, a second etching step is performed to partially etch the hard mask regions 114, using the positive photoresist 610 as an etching mask. Because the openings in the positive photoresist 610 have an increased width, the second etching step etches previously unetched portions of the hard mask regions 114 and portions of the hard mask regions 114 that were previously etched by the first etching step (see FIG. 6G). In this manner, the second etching step causes the recesses 130 to have a stepped profile (e.g., having sidewalls with one or more steps), as shown in FIG. 6I. In some embodiments, the second etching step may etch the hard mask regions 114 an additional depth between about 0.1 µm and about 0.5 µm. The second etching step may include a dry etching process that is similar to that of the first etching step. In some embodiments, the second etching step may use a different dry etching process than the first etching step.

Figure 6J:
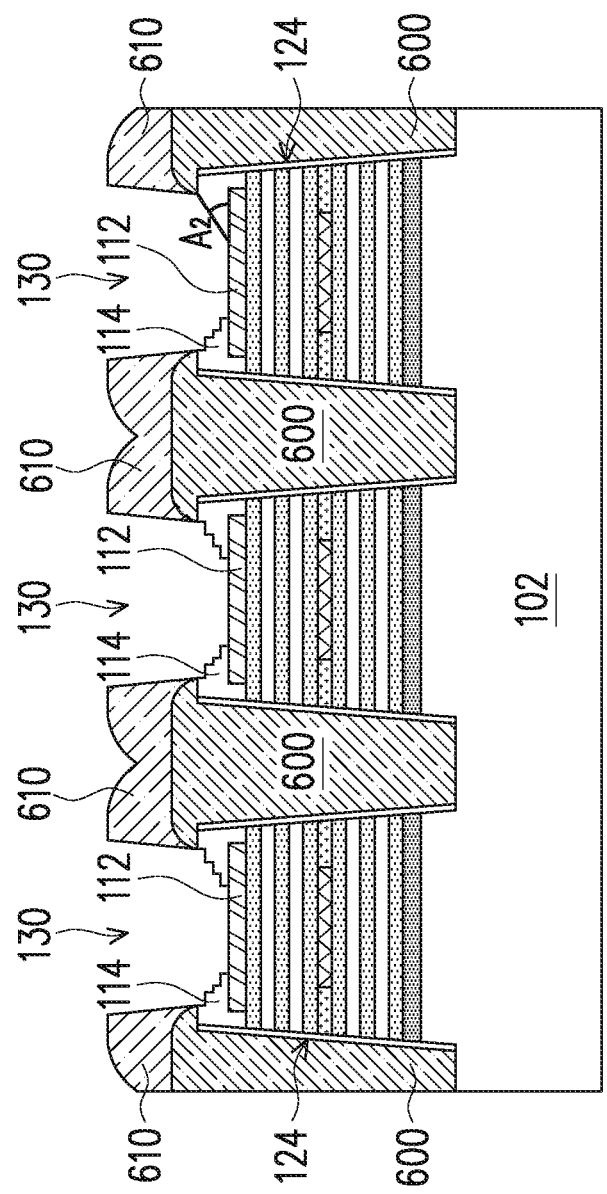

Turning to FIG. 6J, additional trim steps and etching steps are performed to etch the recesses 130, exposing the contact pads 112. For example, after the second etching step shown in FIG. 6I, a second trim step may be performed to further increase the width of the openings in the positive photoresist 610. The second trim step may be similar to the first trim step (see FIG. 6H). A third etching step may then be performed, which may be similar to the second etching step or the first etching step. In this manner, multiple etching cycles that include a trim step and an etching step may be performed, such that alternating trim steps and etching steps are performed. In some cases, after the first etching step, two or more etching cycles may be performed, each cycle including a trim step followed by an etching step. For example, three etching cycles may be performed, resulting in the stepped profile of the recesses 130 shown in FIG. 6J. In other embodiments, more or fewer than three etching cycles may be performed.

By forming the recesses 130 using multiple etching cycles as described, the recesses 130 are formed having a stepped profile. In some cases, the "steps" of the stepped profile may not have uniform heights or lengths. In some cases, the surfaces of the "steps" of the stepped profile may not be vertical or horizontal (e.g., the surfaces may be angled, tapered, irregular, etc.) In some embodiments, the stepped profile of the recesses 130 may have an approximate angle $A_2$ from the top surface of the hard mask regions 114 between about 45° and about 70°, such as about 46°. In some cases, a shallower angle $A_1$ of the positive photoresist 610 (see FIG. 6F) may allow for a shallower angle $A_2$ of the recesses 130, due to larger width increases of the openings in the positive photoresist 610 during trim steps. In some cases, having recesses 130 with a stepped or angled profile allows for an improved joint between the bonding pads 116 and the conductive connections 302, described below with regard to FIG. 12.

Figure 6K:
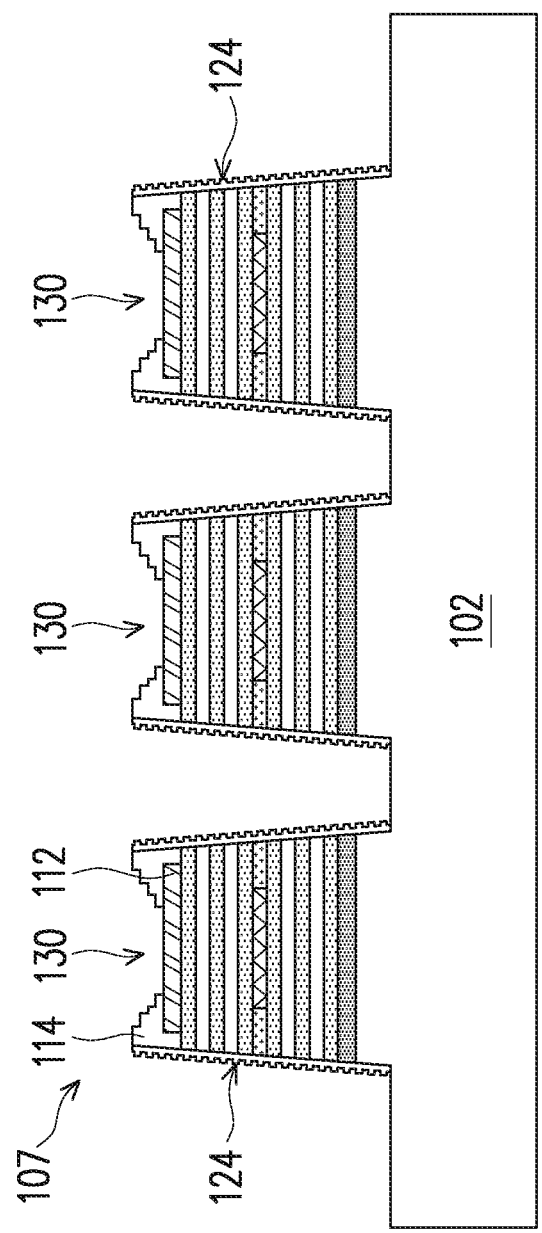

Turning to FIG. 6K, the positive photoresist 610 and the negative photoresist 600 are removed. The positive photoresist 610 and the negative photoresist 600 may be removed using, for example, a wet chemical process or a dry process (e.g., an ashing process). In some embodiments, the positive photoresist 610 is removed in a separate step from the negative photoresist 600. In some cases, the removal of the negative photoresist 600 using a dry process causes the protective spacers 124 to have rougher surfaces, as shown in FIG. 6K.

FIGS. 7A-F illustrate intermediate process steps for forming recesses 130 (see FIG. 7E) in the hard mask regions 114, according to a second embodiment. In the embodiment shown in FIGS. 7A-F, a first positive photoresist 700 is formed but not patterned (see FIG. 7A), and then a second positive photoresist 710 is formed over the first positive photoresist 700 and patterned to form an etching mask (see FIGS. 7B-D). Then, using the patterned second positive photoresist 710 as an etching mask, an etching process using cycles of etch steps and trim steps is used to form the recesses 130 in the hard mask regions 114 (see FIGS. 7E-F). In some cases, forming the first positive photoresist 700 and then second positive photoresist 710 over first positive photoresist 700 may reduce the chance of defects due to improper photoresist patterning and allow for more flexibility in device design, similar to the description above with respect to FIGS. 6A-K.

Figure 7A:
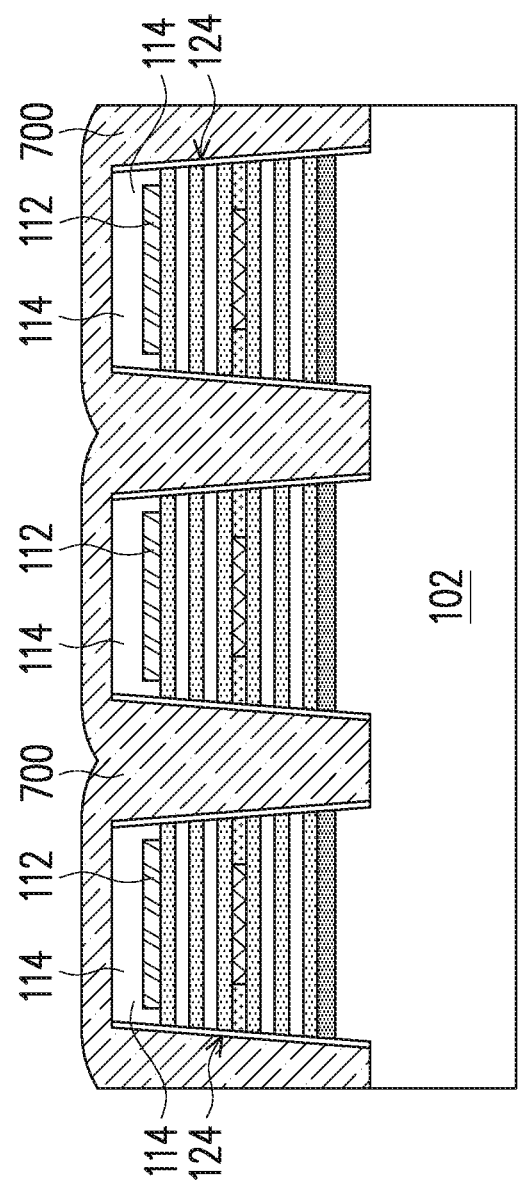
FIGS. 7A through 7F illustrate various cross-sectional views of a process for forming recesses in mesas of a photonic structure, in accordance with a second embodiment.

Turning first to FIG. 7A, the first positive photoresist 700 is formed over the mesas 107 and the carrier substrate 102. The first positive photoresist 700 fills the recesses 109 and may cover top surfaces of the hard mask regions 114. The first positive photoresist 700 may be formed by a suitable process such as spin-coating or the like. In some embodiments, the first positive photoresist 700 may be formed having a thickness over top surfaces of the hard mask regions 114 between about 0 µm and about 5 µm.

Figure 7B:
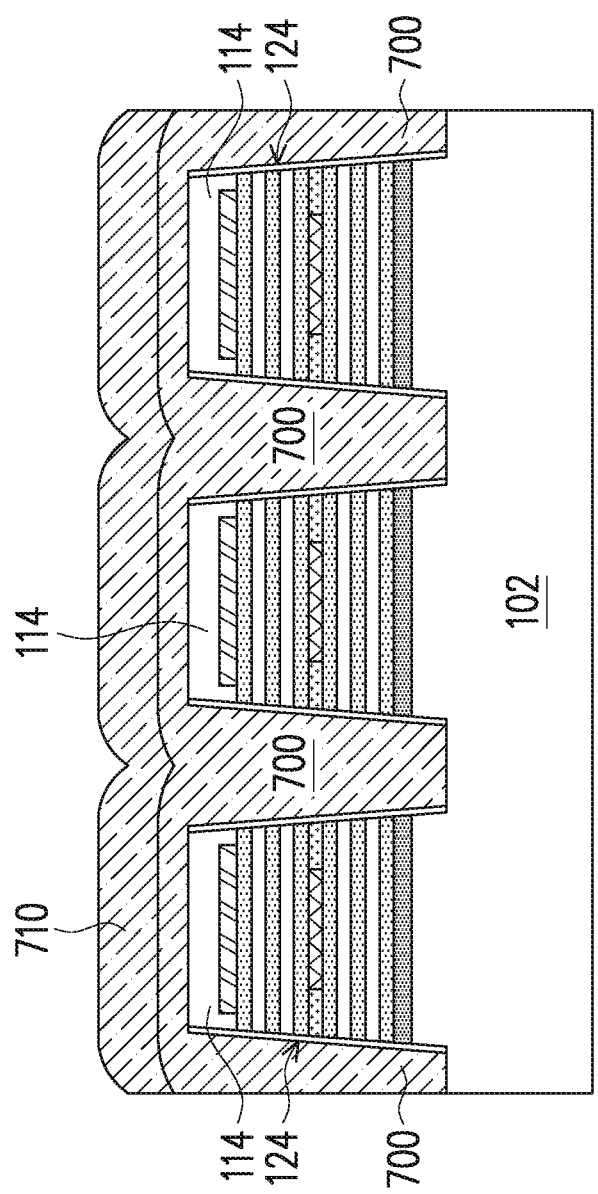

Turning to FIG. 7B, the second positive photoresist 710 is formed over the first positive photoresist 700. The second positive photoresist 710 may be formed by a suitable process such as spin-coating or the like. In some embodiments, the second positive photoresist 710 may be formed having a thickness between about 0 µm and about 5 µm, such as about 2.5 µm.

Figure 7C:
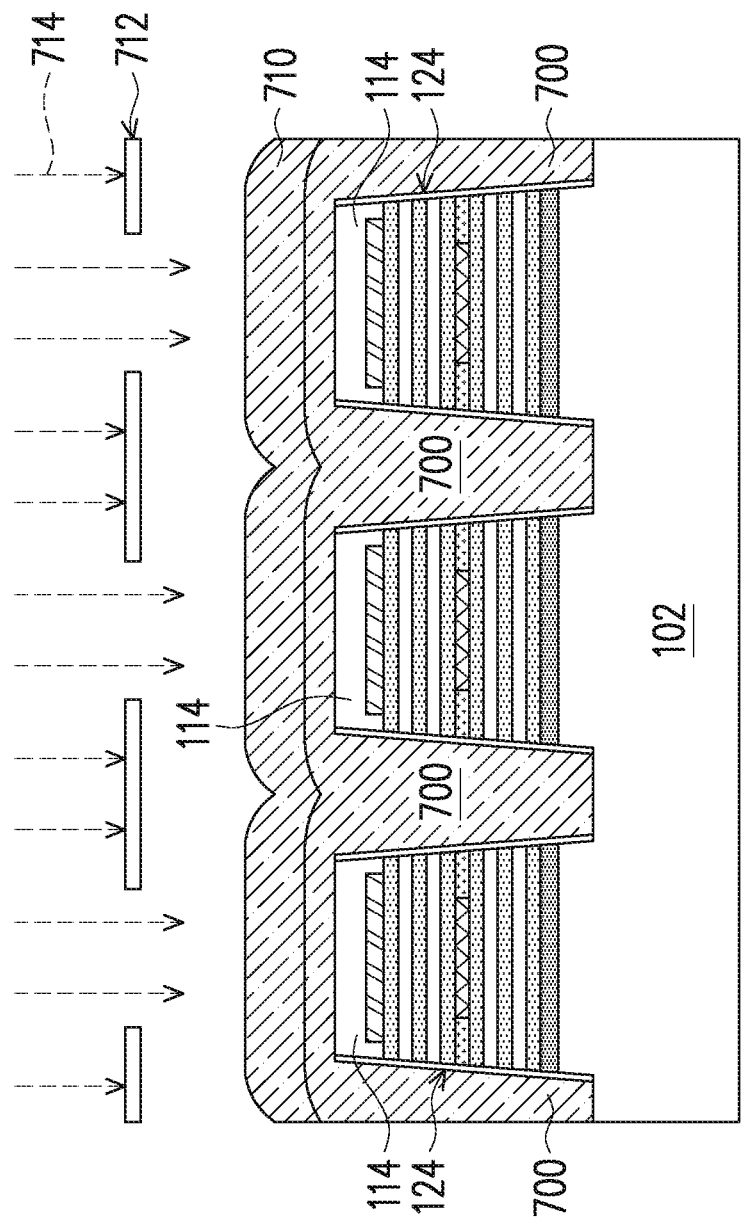

In FIG. 7C, the second positive photoresist 710 is exposed to a light 714 using a photomask 712. The light 714 may be, for example, ultraviolet (UV) light. The photomask 712 may have a pattern such that only some regions of the second positive photoresist 710 directly over the mesas 107 are exposed to the light 714. Regions of the first positive photoresist 700 may also be exposed to the light 714 through the second positive photoresist 710. Upon exposure to the light 714, the exposed regions of the second positive photoresist 710 and the first positive photoresist 700 become less resistant to removal by a developer (see FIG. 7D).

Figure 7D:
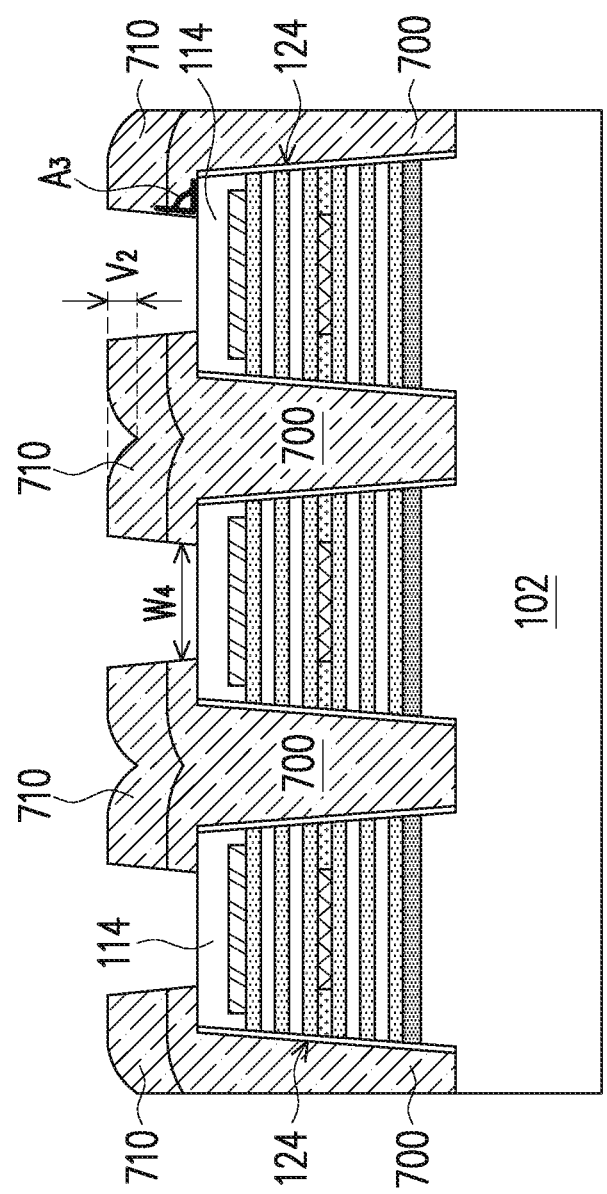

In FIG. 7D, the second positive photoresist 710 and the first positive photoresist 700 are developed, removing portions of the second positive photoresist 710 and the first positive photoresist 700 that were exposed to the light 714. The second positive photoresist 710 and the first positive photoresist 700 may be developed, for example, using a suitable wet chemical developer. In this manner, the second positive photoresist 710 and the first positive photoresist 700 may be patterned, exposing top surfaces of the hard mask regions 114. Some portions of the remaining second positive photoresist 710 and first positive photoresist 700 extend partially over top surfaces of the hard mask regions 114. In some embodiments, after developing, a heat treatment process (e.g., a hard bake) is performed to increase the stability of the remaining second positive photoresist 710 and first positive photoresist 700. In some embodiments, the second positive photoresist 710 protrudes above top surfaces of the hard mask regions 114 a thickness between about 0 µm and about 3 µm, such as about 1.5 µm.

Still referring to FIG. 7D, after developing the second positive photoresist 710 and the first positive photoresist 700, openings in the second positive photoresist 710 and the first positive photoresist 700 over the hard mask regions 114 may have a width $W_4$ between about 1 µm and about 12 µm. In some embodiments, the variation $V_2$ in the height of the second positive photoresist 710 may be less than about 1 µm. In some embodiments, the openings in the second positive photoresist 710 and the first positive photoresist 700 make an angle $A_3$ with a top surface of the hard mask regions 114 between about 30° and about 90°, such as about 84°.

Figure 7E:
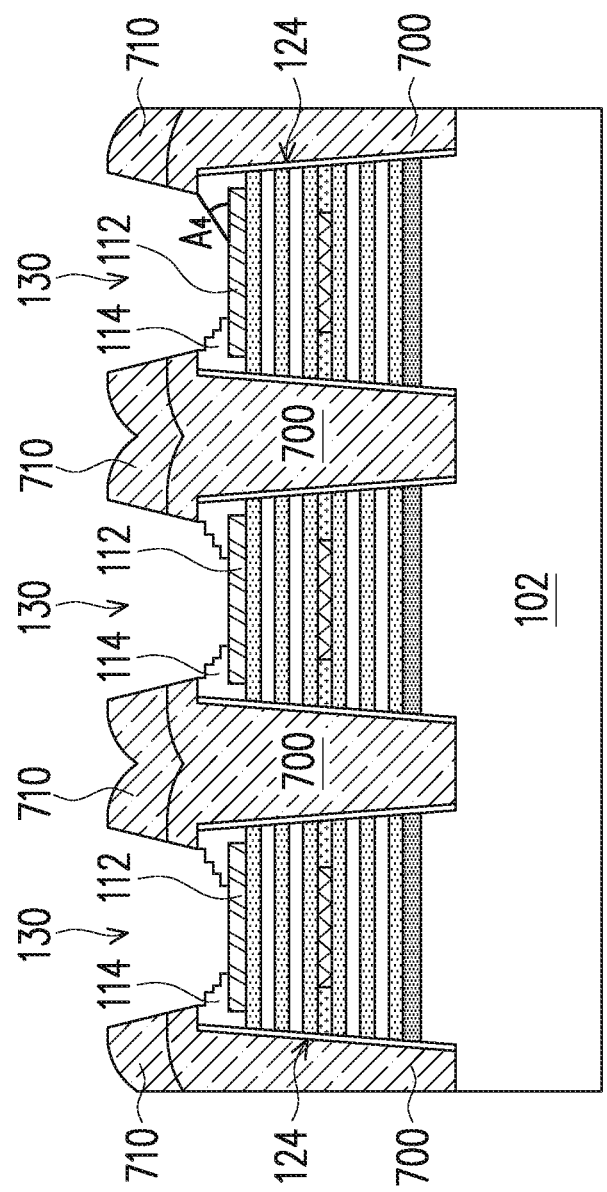

In FIG. 7E, recesses 130 are formed in the hard mask regions 114, exposing the contact pads 112. The recesses 130 may be formed using a dry etching process and trim processes similar to that described previously with respect to FIGS. 6G-J. For example, the recesses 130 may be formed using a first etching step followed by one or more cycles of trim steps and etching steps. The process details of the dry etching process including the etching steps and trim steps may be similar to those described previously with respect to FIGS. 6G-J and are not repeated here. Additionally, by forming the recesses 130 using multiple etching cycles as described, the recesses 130 are formed having a stepped profile. In some cases, the "steps" of the stepped profile may not have uniform heights or lengths. In some cases, the surfaces of the "steps" of the stepped profile may not be vertical or horizontal (e.g., the surfaces may be angled, tapered, irregular, etc.) In some embodiments, the stepped profile of the recesses 130 may have an approximate angle $A_4$ from the top surface of the hard mask regions 114 between about 45° and about 70°, such as about 64°. In some cases, a shallower angle $A_3$ (see FIG. 7D) may allow for a shallower angle $A_4$ of the recesses 130. In some cases, having recesses 130 with a stepped or angled profile allows for an improved joint between the bonding pads 116 and the conductive connections 302, described below with regard to FIG. 12.

Figure 7F:
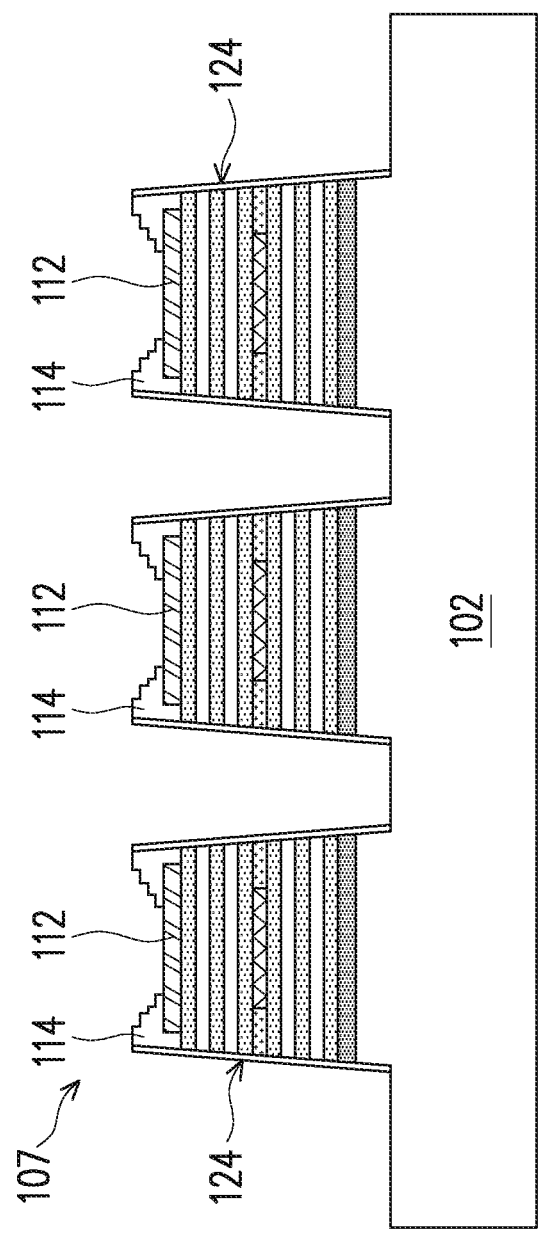

Turning to FIG. 7F, the second positive photoresist 710 and the first positive photoresist 700 are removed. The second positive photoresist 710 and the first positive photoresist 700 may be removed using, for example, a wet chemical process or a dry process (e.g., an ashing process). In some embodiments, the second positive photoresist 710 is removed in a separate step from the first positive photoresist 700. In some cases, after removal of the first positive photoresist 700, the protective spacers 124 may have smoother surfaces than the surfaces of the protective spacers 124 after removal of the negative photoresist 600, described previously with regard to FIG. 6K.

FIGS. 8A-F illustrate intermediate process steps for forming recesses 130 (see FIG. 8E) in the hard mask regions 114, according to a third embodiment. In the embodiment shown in FIGS. 8A-F, a negative photoresist 800 is formed but not patterned, and then a positive photoresist 810 is formed over the negative photoresist 800 and patterned to form an etching mask (see FIGS. 8B-D). Then, using the patterned positive photoresist 810 as an etching mask, an etching process using cycles of etch steps and trim steps is used to form the recesses 130 in the hard mask regions 114 (see FIGS. 8E-F). In some cases, forming the negative photoresist 800 and then positive photoresist 810 over negative photoresist 800 may reduce the chance of defects due to improper photoresist patterning and allow for more flexibility in device design, similar to the description above with respect to FIGS. 6A-K.

Figure 8A:
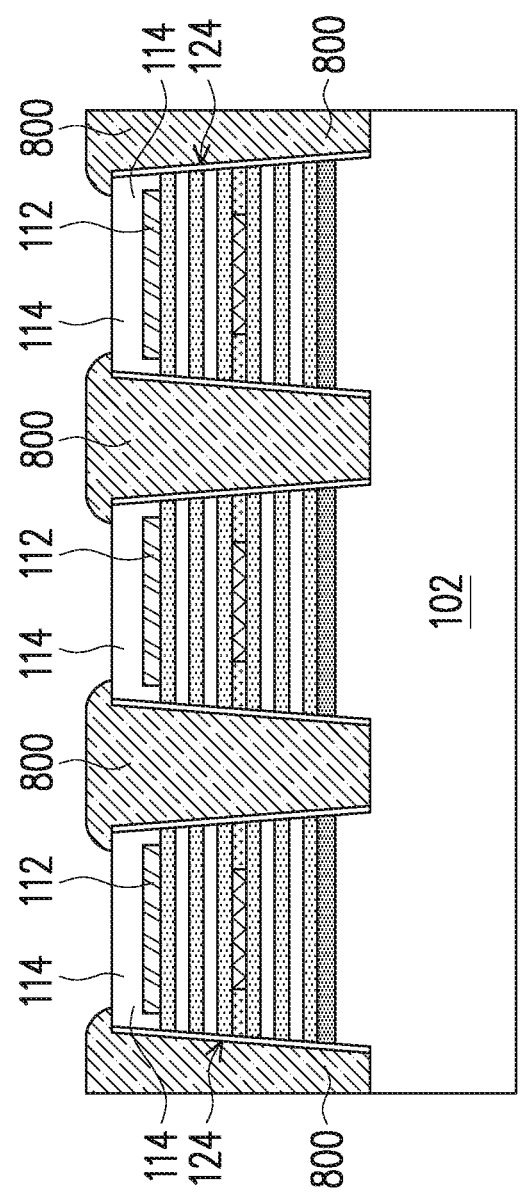
FIGS. 8A through 8F illustrate various cross-sectional views of a process for forming recesses in mesas of a photonic structure, in accordance with a third embodiment.

Turning first to FIG. 8A, the negative photoresist 800 is formed over the mesas 107 and the carrier substrate 102. The negative photoresist 800 fills the recesses 109 and may cover portions of the top surfaces of the hard mask regions 114. The negative photoresist 800 may be formed by a suitable process such as spin-coating or the like. In some embodiments, the rotation speed of the spin-coating process may be controlled such that portions of the top surfaces of the hard mask regions 114 are free of the negative photoresist 800 after performing the spin-coating process. In some embodiments, the negative photoresist 800 may protrude above top surfaces of the hard mask regions 114, as shown in FIG. 8A, or may be at or below top surfaces of the hard mask regions 114. Top surfaces of the negative photoresist 800 may have a convex shape (as shown in FIG. 8A), flat shape, concave shape, or other shape.

Figure 8B:
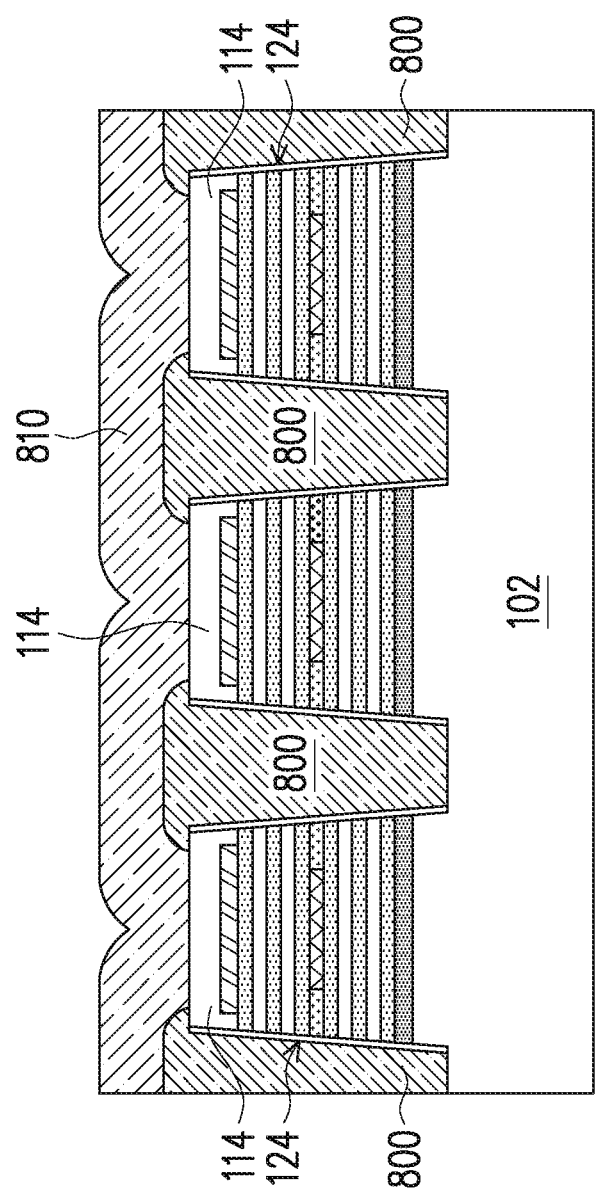

Turning to FIG. 8B, the positive photoresist 810 is formed over the negative photoresist 800. The positive photoresist 810 may be formed by a suitable process such as spin-coating or the like. In some embodiments, the positive photoresist 810 may be formed having a thickness between about 0 µm and about 5 µm, such as about 2.5 µm.

Figure 8C:
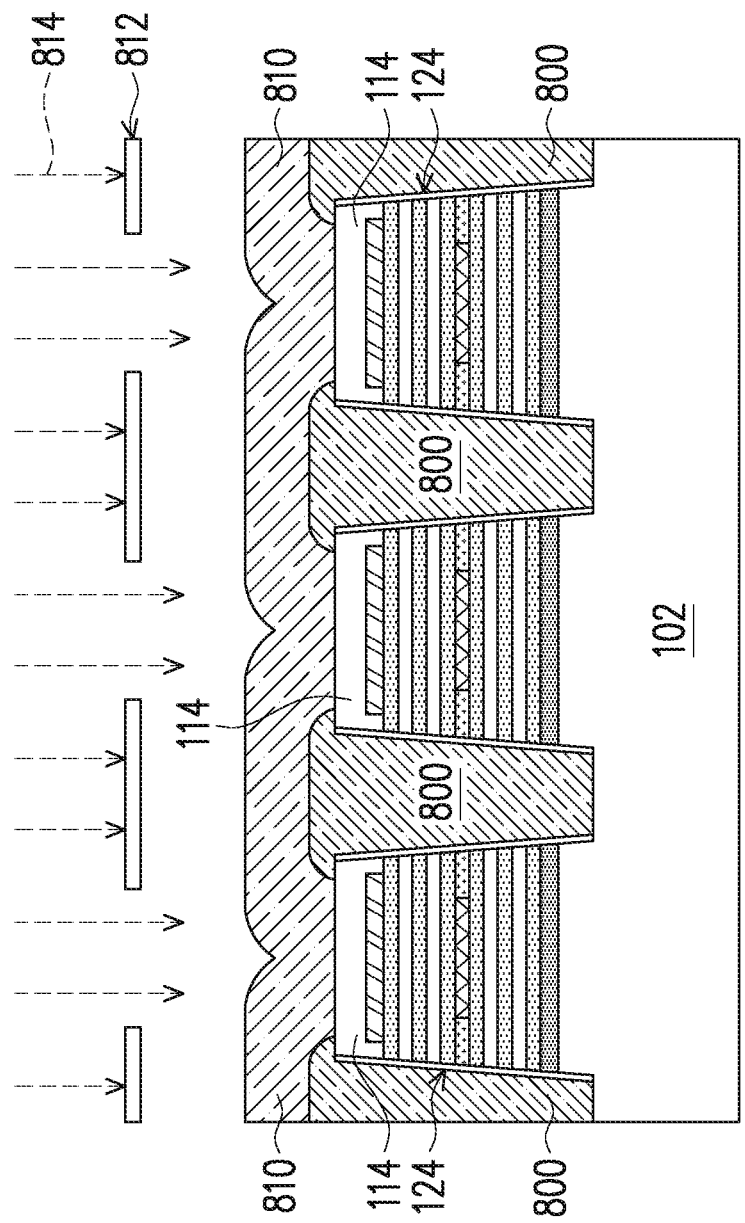

In FIG. 8C, the positive photoresist 810 is exposed to a light 814 using a photomask 812. The light 814 may be, for example, ultraviolet (UV) light. The photomask 812 may have a pattern such that only some regions of the positive photoresist 810 directly over the mesas 107 are exposed to the light 814. Upon exposure to the light 814, the exposed regions of the positive photoresist 810 become less resistant to removal by a developer (see FIG. 8D).

Figure 8D:
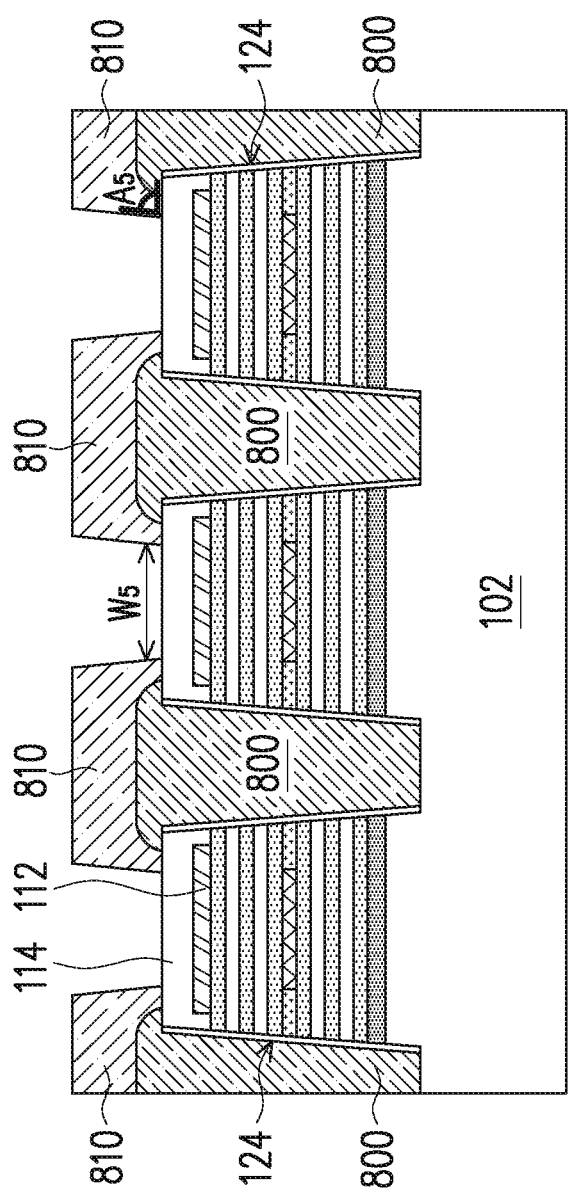

In FIG. 8D, the positive photoresist 810 is developed, removing portions of the positive photoresist 810 that were exposed to the light 814. The positive photoresist 810 may be developed, for example, using a suitable wet chemical developer. In this manner, the positive photoresist 810 may be patterned, exposing top surfaces of the hard mask regions 114. Some portions of the remaining positive photoresist 810 extend partially over top surfaces of the hard mask regions 114. In some embodiments, after developing, a heat treatment process (e.g., a hard bake) is performed to increase the stability of the remaining positive photoresist 810.

Still referring to FIG. 8D, after developing the positive photoresist 810, openings in the positive photoresist 810 over the hard mask regions 114 may have a width $W_5$ between about 1 µm and about 12 µm. In some embodiments, the openings in the positive photoresist 810 make an angle $A_5$ with a top surface of the hard mask regions 114 between about 30° and about 90°, such as about 84°.

Figure 8E:
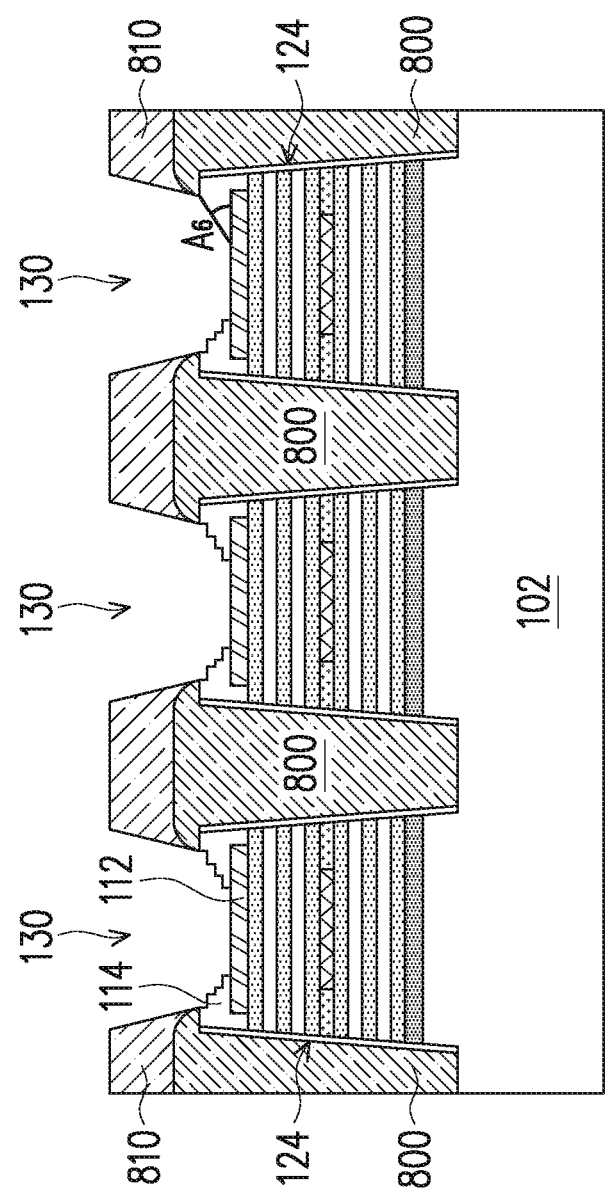

In FIG. 8E, recesses 130 are formed in the hard mask regions 114, exposing the contact pads 112. The recesses 130 may be formed using a dry etching and trimming process similar to that described previously with respect to FIGS. 6G-J. For example, the recesses 130 may be formed using a first etching step followed by one or more cycles of trim steps and etching steps. The process details of the dry etching process including the etching steps and trim steps may be similar to those described previously with respect to FIGS. 6G-J and are not repeated here. Additionally, by forming the recesses 130 using multiple etching cycles as described, the recesses 130 are formed having a stepped profile. In some cases, the "steps" of the stepped profile may not have uniform heights or lengths. In some cases, the surfaces of the "steps" of the stepped profile may not be vertical or horizontal (e.g., the surfaces may be angled, tapered, irregular, etc.) In some embodiments, the stepped profile of the recesses 130 may have an approximate angle $A_6$ from the top surface of the hard mask regions 114 between about 45° and about 70°, such as about 64°. In some cases, a shallower angle $A_5$ (see FIG. 8D) may allow for a shallower angle $A_6$ of the recesses 130. In some cases, having recesses 130 with a stepped or angled profile allows for an improved joint between the bonding pads 116 and the conductive connections 302, described below with regard to FIG. 12.

Figure 8F:
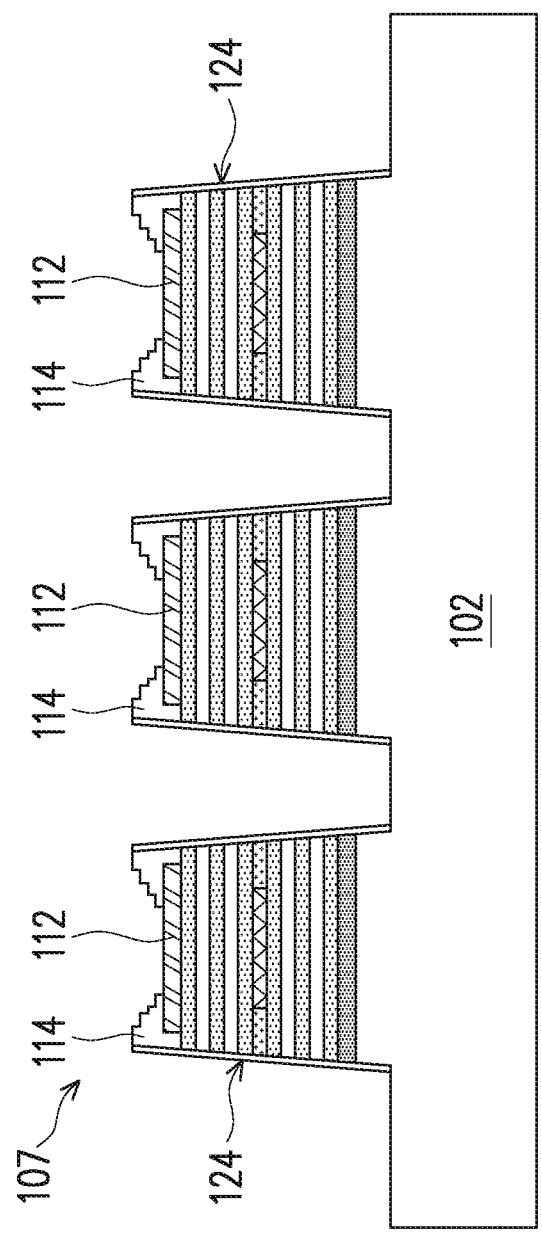

Turning to FIG. 8F, the positive photoresist 810 and the negative photoresist 800 are removed. The positive photoresist 810 and the negative photoresist 800 may be removed using, for example, a wet chemical process or a dry process (e.g., an ashing process). In some embodiments, the positive photoresist 810 is removed in a separate step from the negative photoresist 800. In some cases, since the negative photoresist 800 has not been developed, after removal of the negative photoresist 800, the protective spacers 124 may have smoother surfaces than the surfaces of the protective spacers 124 after removal of the negative photoresist 600, described previously with regard to FIG. 6K.

FIGS. 9A-F illustrate intermediate process steps for forming recesses 130 (see FIG. 9E) in the hard mask regions 114, according to a fourth embodiment. In the embodiment shown in FIGS. 9A-F, a first positive photoresist 900 is formed but not patterned, and then a second positive photoresist 910 is formed over the first positive photoresist 900 and patterned to form an etching mask (see FIGS. 9B-D). Then, using the patterned second positive photoresist 910 as an etching mask, an etching process using cycles of etch steps and trim steps is used to form the recesses 130 in the hard mask regions 114 (see FIGS. 9E-F). In some cases, forming the first positive photoresist 900 and then second positive photoresist 910 over first positive photoresist 900 may reduce the chance of defects due to improper photoresist patterning and allow for more flexibility in device design, similar to the description above with respect to FIGS. 6A-K.

Figure 9A:
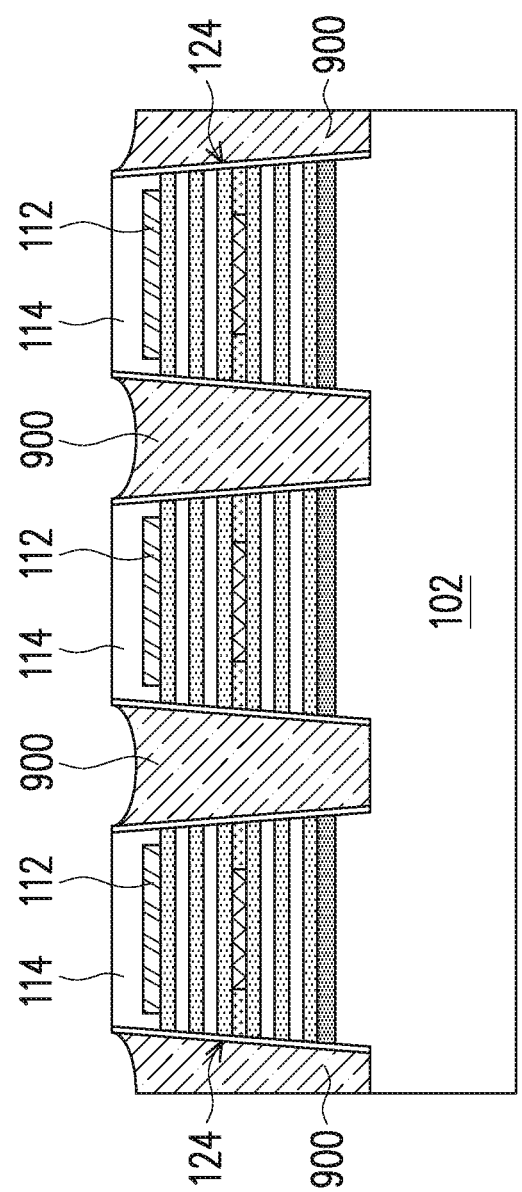
Figure 10:
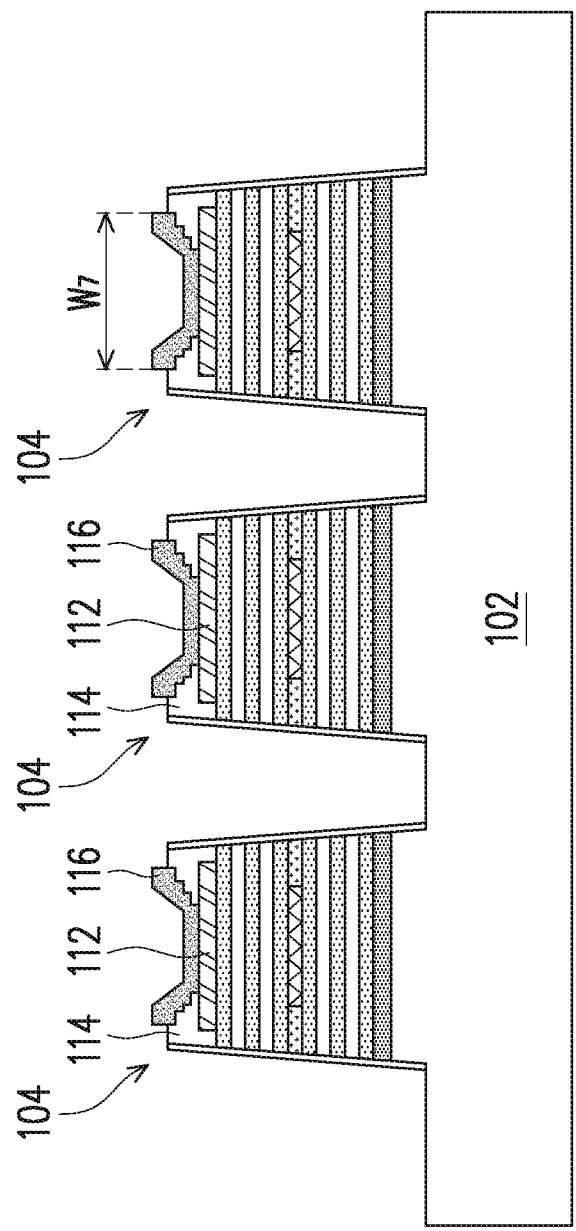
FIG. 10 illustrates a cross-sectional view of a process for forming a photonic structure, in accordance with some embodiments.

Turning first to FIG. 9A, the first positive photoresist 900 is formed over the mesas 107 and the carrier substrate 102. The first positive photoresist 900 at least partially fills the recesses 109. In some embodiments, the first positive photoresist 900 may cover portions of the top surfaces of the hard mask regions 114. The first positive photoresist 900 may be formed by a suitable process such as spin-coating or the like. In some embodiments, the rotation speed of the spin-coating process may be controlled such that portions of the top surfaces of the hard mask regions 114 are free of the first positive photoresist 900 after performing the spin-coating process. In some embodiments, the first positive photoresist 900 may protrude above top surfaces of the hard mask regions 114 or may be at or below top surfaces of the hard mask regions 114, as shown in FIG. 9A. Top surfaces of the first positive photoresist 900 may have a convex shape, flat shape, concave shape (as shown in FIG. 9A), or other shape.

Figure 9B:
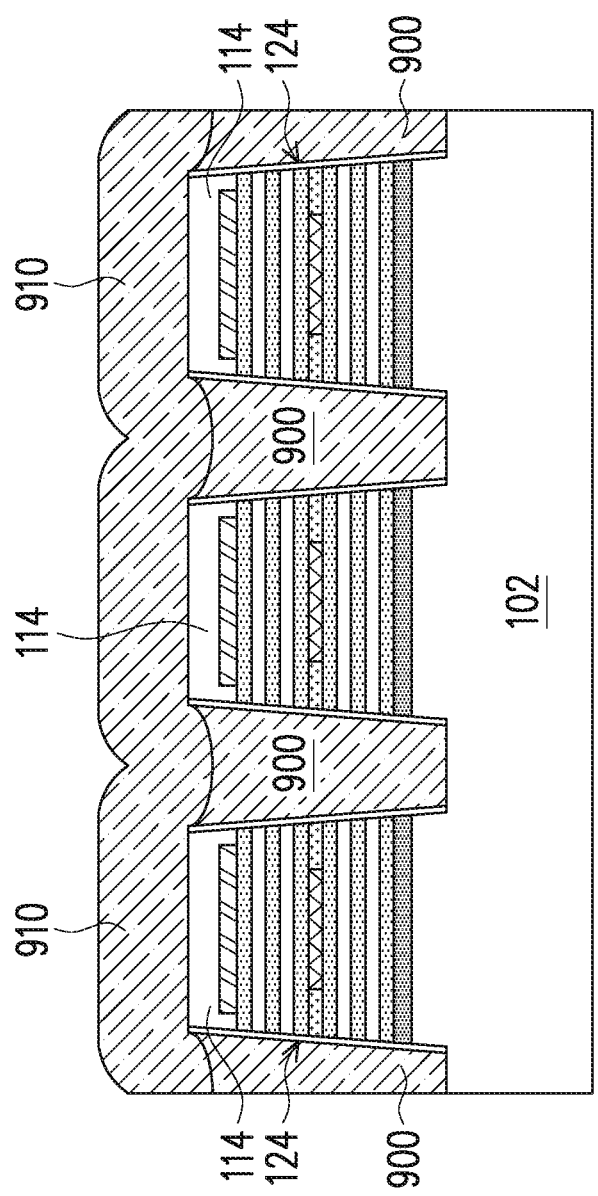

Turning to FIG. 9B, the second positive photoresist 910 is formed over the first positive photoresist 900. The second positive photoresist 910 may be formed by a suitable process such as spin-coating or the like. In some embodiments, the second positive photoresist 910 may be formed having a thickness between about 0 µm and about 5 µm, such as about 2.5 µm.

Figure 9C:
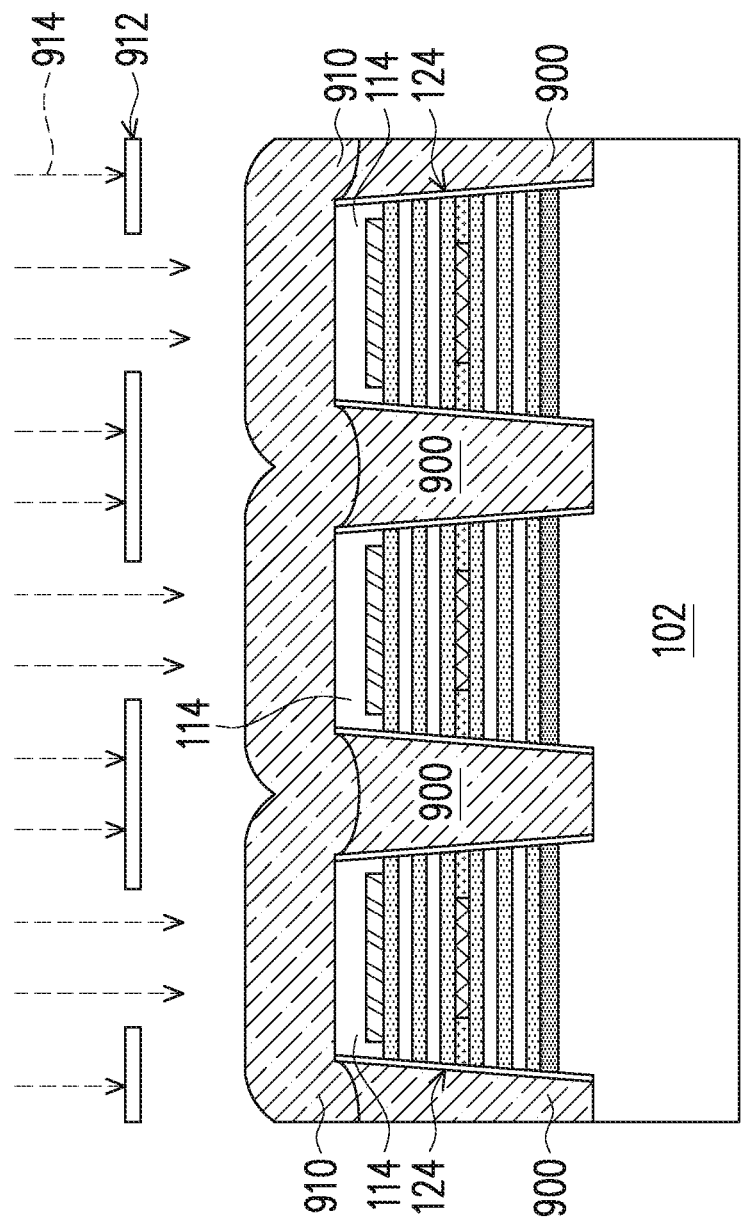

In FIG. 9C, the second positive photoresist 910 is exposed to a light 914 using a photomask 912. The light 914 may be, for example, ultraviolet (UV) light. The photomask 912 may have a pattern such that only some regions of the second positive photoresist 910 directly over the mesas 107 are exposed to the light 914. Upon exposure to the light 914, the exposed regions of the second positive photoresist 910 become less resistant to removal by a developer (see FIG. 9D).

Figure 9D:
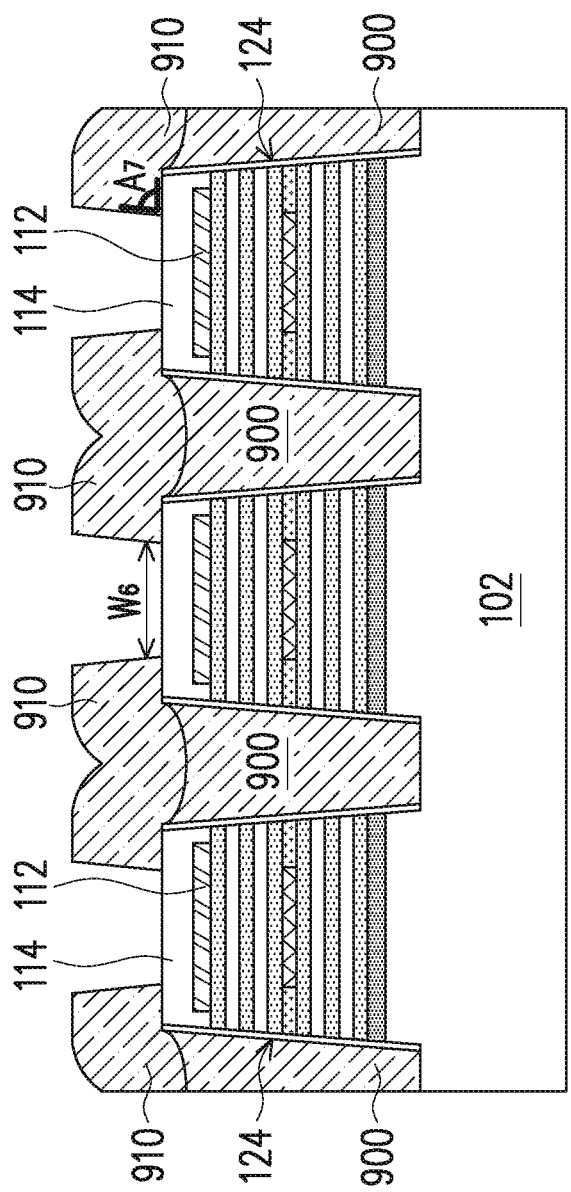

In FIG. 9D, the second positive photoresist 910 is developed, removing portions of the second positive photoresist 910 that were exposed to the light 914. The second positive photoresist 910 may be developed, for example, using a suitable wet chemical developer. In this manner, the second positive photoresist 910 may be patterned, exposing top surfaces of the hard mask regions 114. Some portions of the remaining second positive photoresist 910 extend partially over top surfaces of the hard mask regions 114. In some embodiments, after developing, a heat treatment process (e.g., a hard bake) is performed to increase the stability of the remaining second positive photoresist 910. In some embodiments, the second positive photoresist 910 protrudes above top surfaces of the hard mask regions 114 a thickness between about 0 µm and about 3 µm, such as about 1.5 µm.

Still referring to FIG. 9D, after developing the second positive photoresist 910, openings in the second positive photoresist 910 over the hard mask regions 114 may have a width $W_5$ between about 1 µm and about 12 µm. In some embodiments, the openings in the second positive photoresist 910 make an angle $A_7$ with a top surface of the hard mask regions 114 between about 30° and about 90°.

Figure 9E:
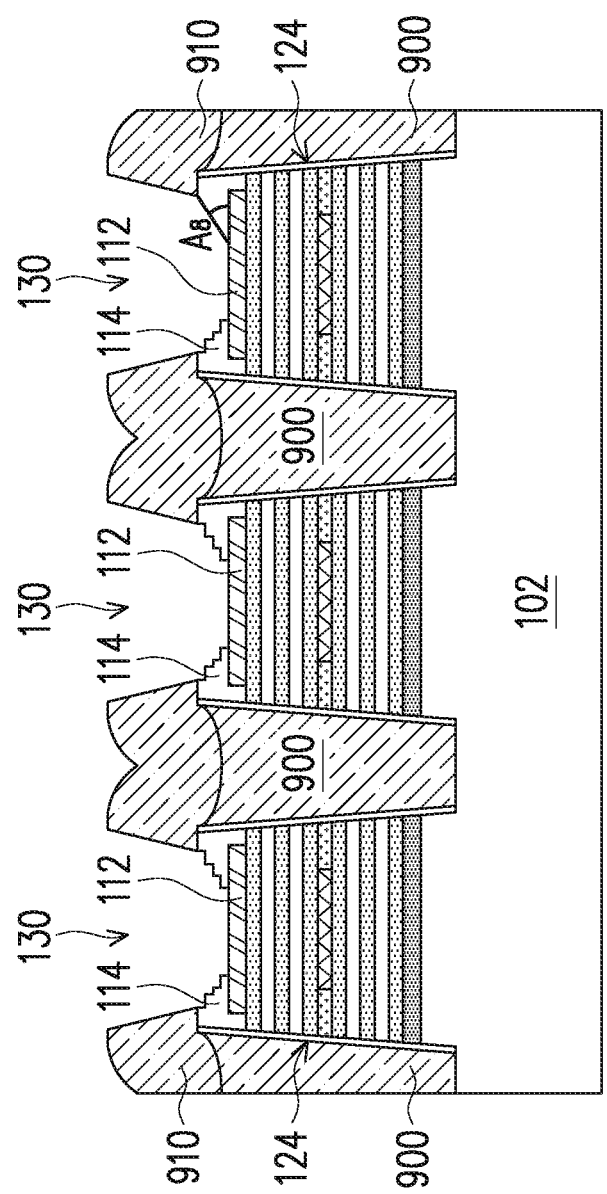

In FIG. 9E, recesses 130 are formed in the hard mask regions 114, exposing the contact pads 112. The recesses 130 may be formed using a dry etching process and trimming process similar to that described previously with respect to FIGS. 6G-J. For example, the recesses 130 may be formed using a first etching step followed by one or more cycles of trim steps and etching steps. The process details of the dry etching process including the etching steps and trim steps may be similar to those described previously with respect to FIGS. 6G-J and are not repeated here. Additionally, by forming the recesses 130 using multiple etching cycles as described, the recesses 130 are formed having a stepped profile. In some cases, the "steps" of the stepped profile may not have uniform heights or lengths. In some cases, the surfaces of the "steps" of the stepped profile may not be vertical or horizontal (e.g., the surfaces may be angled, tapered, irregular, etc.) In some embodiments, the stepped profile of the recesses 130 may have an approximate angle $A_8$ from the top surface of the hard mask regions 114 between about 45° and about 70°, such as about 64°. In some cases, a shallower angle $A_7$ (see FIG. 9D) may allow for a shallower angle $A_8$ of the recesses 130. In some cases, having recesses 130 with a stepped or angled profile allows for an improved joint between the bonding pads 116 and the conductive connectors 302, described below with regard to FIG. 12.

Turning to FIG. 9F, the second positive photoresist 910 and the first positive photoresist 900 are removed. The second positive photoresist 910 and the first positive photoresist 900 may be removed using, for example, a wet chemical process or a dry process (e.g., an ashing process). In some embodiments, the second positive photoresist 910 is removed in a separate step from the first positive photoresist 900. In some cases, after removal of the first positive photoresist 900, the protective spacers 124 may have smoother surfaces than the surfaces of the protective spacers 124 after removal of the negative photoresist 600, described previously with regard to FIG. 6K.

Turning now to FIG. 10, bonding pads 116 are formed on the hard mask regions 114 and contact pads 112, making electrical connection with the contact pads 112, thereby forming a first structure 100. In some embodiments, a photoresist is formed and patterned over the mesas 107, including over the hard mask regions 114 and contact pads 112. The photoresist may be formed by spin-coating or the like and may be exposed to light for patterning. The patterning forms openings through the photoresist corresponding to the bonding pads 116. A conductive material is formed on the exposed portions of the hard mask regions 114 and on exposed portions of the contact pads 112, forming bonding pads 116. The conductive material may be formed using PVD, electron-beam PVD, plating process, or the like. The conductive material may include Ti, Ta, Ni, Cu, Sn, In, Au, Al, Pt, Pd, Ag, the like, or a combination. In some embodiments, the conductive material of the bonding pads 116 has a thickness between about 0.3 µm and about 2 µm, such as about 0.7 µm. Then, the photoresist and excess conductive material are removed by a suitable process such as an ashing process. In some embodiments, the bonding pads 116 may have a width $W_7$ between about 3 µm and about 14 µm, such as about 8 µm. The conductive material of the bonding pads 116 may be formed conformally over the hard mask regions 114 and contact pads 112, such that the bonding pads 116 have angled sidewalls due to the stepped profile of the hard mask regions 114. In some cases, the bonding pads 116 have a concave shape, bowl shape, or similar shape. In this manner, light-emitting diodes 104 are formed on the carrier substrate 102.

Figure 11:
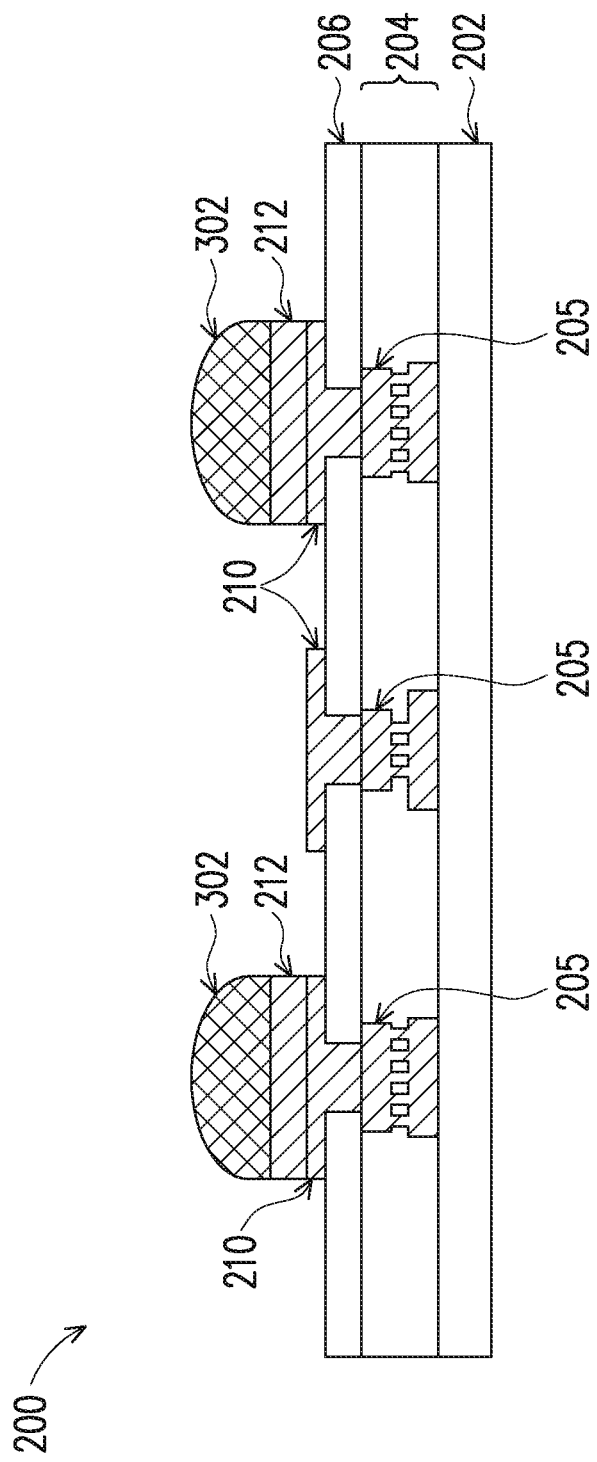
FIG. 11 illustrates a cross-sectional view of a process for forming an interconnect structure, in accordance with some embodiments.

FIG. 11 illustrates a cross-sectional view of a second structure 200, in accordance with some embodiments. The second structure 200 may be a device such as an integrated circuit, an interposer, or the like. The second structure 200 includes a semiconductor substrate 202, with devices such as transistors, diodes, capacitors, resistors, etc., formed in and/or on the semiconductor substrate 202. The devices may be interconnected by an interconnect structure 204 formed by, for example, metallization patterns in one or more dielectric layers on the semiconductor substrate to form an integrated circuit. The interconnect structure 204 includes conductive layers 205, some of which may be used for coupling to the light-emitting diodes 104. The conductive layers 205 may be a conductive material such as copper, aluminum, the like, or a combination. A passivation layer 206 may be formed over the interconnect structure 204 to protect the structure. The passivation layer 206 may be made of one or more suitable dielectric materials such as silicon oxide, silicon nitride, low-k dielectrics, molding compound, the like, or a combination. The second structure 200 also includes contact pads 210, such as aluminum or copper pads, to which external connections are made. The contact pads 210 are on what may be referred to as respective active sides of the second structure 200, and may be formed extending through the passivation layer 206 by a suitable technique, such as by using photolithography, etching, and deposition processes. The deposition of the material of the contact pads 210 may be performed using a plating process, such as electroplating or electroless plating, although other processes of formation, such as sputtering, evaporation, or a PECVD process, may be used. The contact pads 210 make electrical connections to the pads 205 of the interconnect structure 204.

In some embodiments, UBMs 212 may be formed over some or all of the contact pads 210. In FIG. 11, the UBMs 212 are shown formed only over contact pads 210 that subsequently make electrical connection to n-type sides of the light-emitting diodes 104 (see FIG. 12). The UBMs 212 may be formed over the contact pads 210 by a suitable technique, such as by using photolithography, etching, and deposition processes. The UBMs 212 may include one or more conductive materials, such as copper, nickel, titanium, gold, tungsten, the like, or a combination. The deposition of the conductive materials may be performed using a plating process, such as electroplating or electroless plating, although other processes of formation, such as sputtering, evaporation, or a PECVD process, may be used.

Still referring to FIG. 11, conductive connectors 302 may be formed on the UBMs 212 from a conductive material such as solder, copper, aluminum, gold, nickel, silver, palladium, tin, the like, or a combination thereof. In some embodiments, the conductive connectors 302 are solder bumps. In some embodiments, the conductive connectors 302 are formed by initially forming a layer of solder on the UBMs 212 through a suitable method such as evaporation, electroplating, printing, solder transfer, ball placement, or the like. Once a layer of solder has been formed on the UBMs 212, a reflow may be performed in order to shape the material into the desired bump shapes for the conductive connectors 302.

FIGS. 12 through 20 illustrate various cross-sectional views of intermediate stages of a process for forming a photonic device 300, in accordance with some embodiments. Parts of the photonic device 300 may operate as, for example, a light source or laser. The photonic device 300 may be packaged in further processing to form, e.g., an image sensor, a fiber optic networking device, or the like. The resulting device may be part of an integrated circuit device, such as a system-on-chip (SoC).

Figure 12:
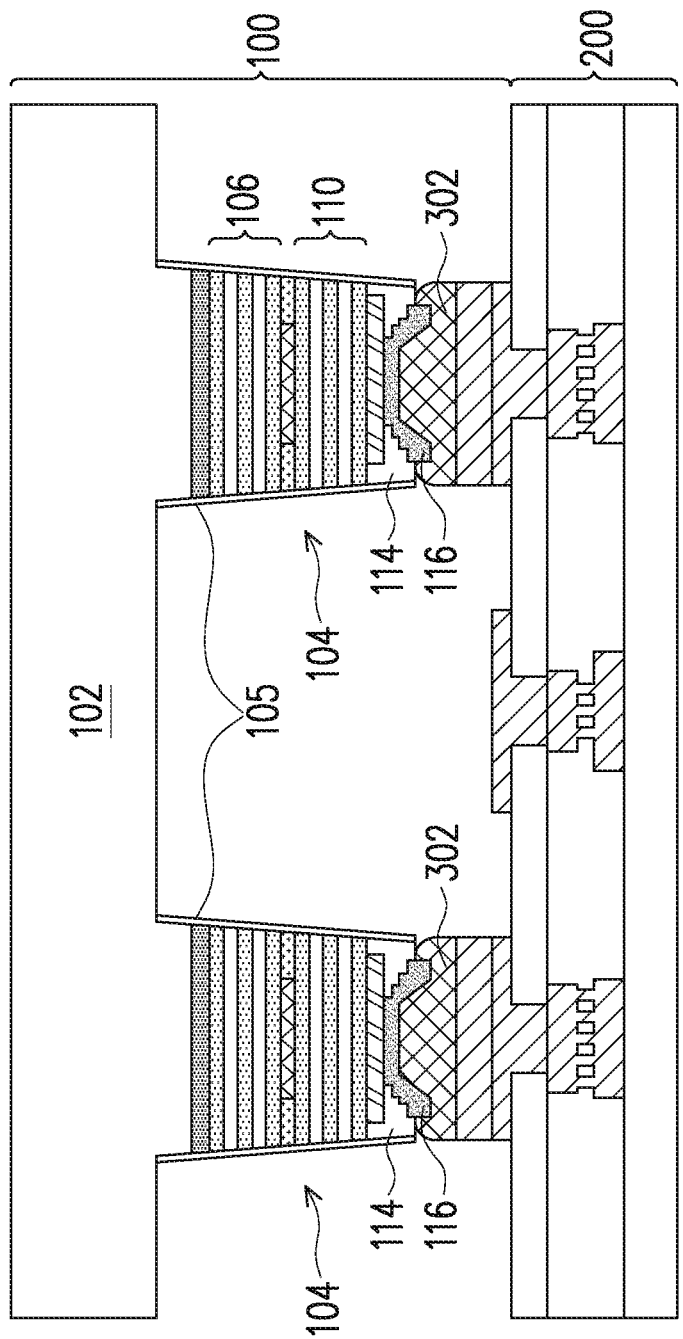
FIGS. 12 through 20 illustrate various cross-sectional views of a process for forming a photonic device, in accordance with some embodiments.

In FIG. 12, the first structure 100 is electrically and physically connected to the second structure 200. The light emitting diodes 104 of the first structure 100 are connected to conductive layers 205 of the second structure 200 by joining the bonding pads 116 of the first structure 100 to the conductive connectors 302 of the second structure 200. In some embodiments, the bonding pads 116 are placed in contact with the conductive connectors 302 and then a reflow process is performed. In some cases, the angled sidewalls of the bonding pads 116 (due to the stepped profile of the hard mask regions 114) allows the conductive connectors 302 to physically contact more surface area of the bonding pads 116. For example, a shallower sidewall angle between the bottom surfaces of the bonding pads 116 and the sidewalls of the bonding pads 116 may allow the material of the conductive connectors 302 to more easily flow into regions that are near both the bottom surfaces of the bonding pads 116 and the sidewalls of the bonding pads 116. Additionally, voids between the bonding pads 116 and the conductive connectors 302 can increase resistance between the first structure 100 and the second structure 200. In some cases, the angled sidewalls of the bonding pads 116 can reduce the chance of voids being present between the bonding pads 116 and the conductive connectors 302 after contact or reflow. In this manner, the electrical and physical connection between the first structure 100 and the second structure 200 may be improved, and thus the performance of the photonic device 300 may be improved.

In some embodiments, the first structure 100 is connected to the second structure 200 such that the second reflective structures 110 (e.g., n-type sides or cathodes) of the light-emitting diodes 104 face towards the second structure 200, and the first reflective structures 106 (e.g., p-type sides or anodes) of the light-emitting diodes 104 face towards the first structure 100. As noted above with respect to FIG. 4, the first reflective structure 106 may have a lower reflectivity than the second reflective structure 110. As such, more of the produced light emission (e.g., laser light) from the emitting semiconductor region 108 is reflected by the second reflective structure 110 than by the first reflective structure 106. As such, more of the light emission is transmitted through the first reflective structure 106 (e.g., in a direction away from the second structure 200).

Figure 13:
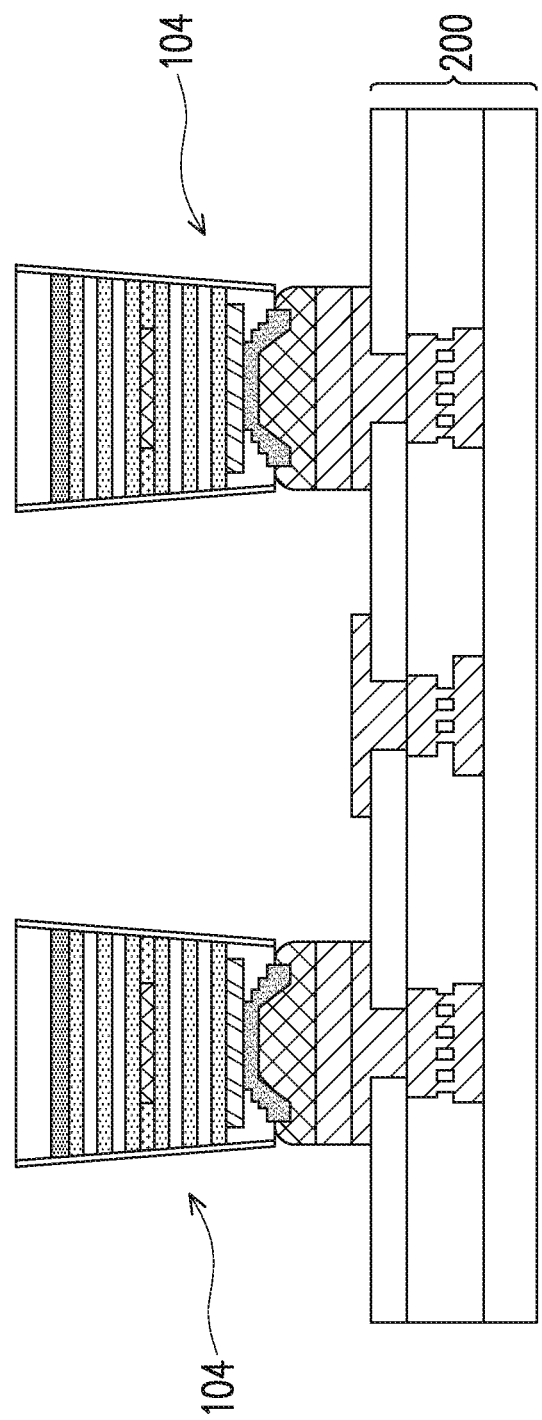

In FIG. 13, the carrier substrate 102 is removed, leaving the light emitting diodes 104 remaining attached to the second structure 200. The carrier substrate 102 may be removed by one or more etching processes, which may include a wet etching process and/or a dry etching process. In some embodiments, the carrier substrate 102 is removed using an etching process that is selective to the material of the carrier substrate 102 over the etch stop layer 105. The etch stop layer 105 may then be removed using a separate wet or dry etching process. After removal of the carrier substrate 102 and the etch stop layer 105, the light emitting diodes 104 remain attached to the second structure 200.

Figure 14:
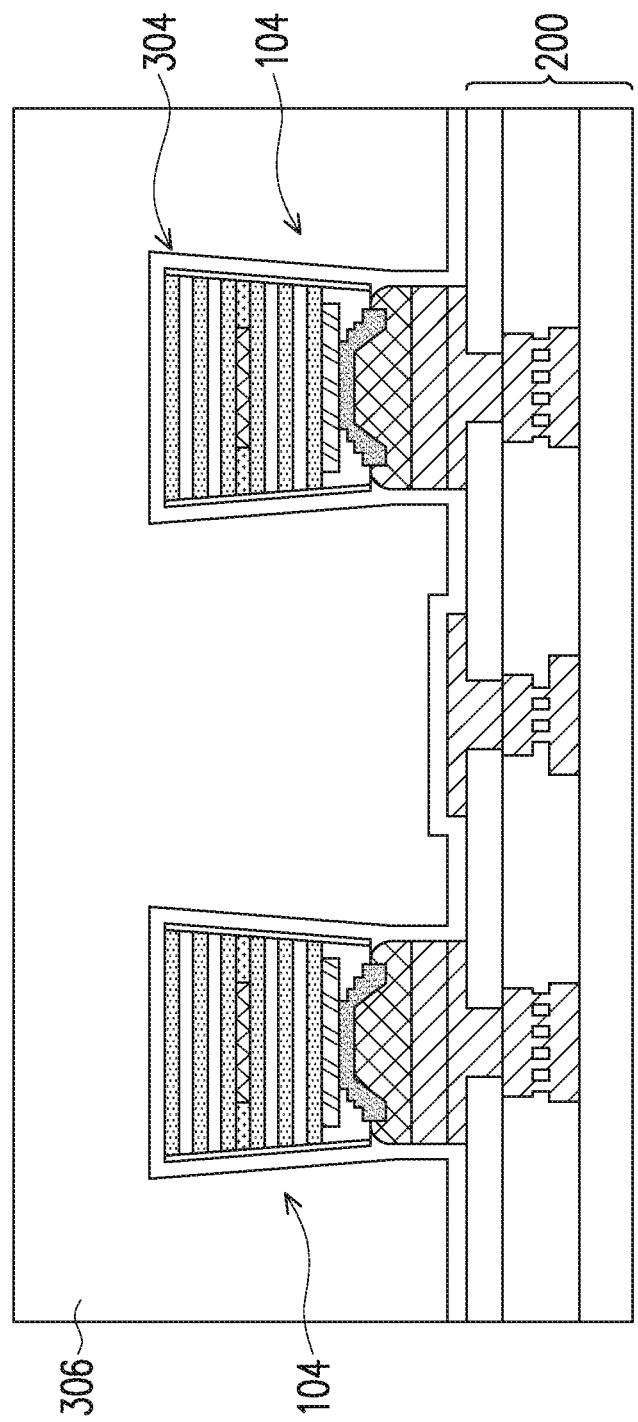

In FIG. 14, a passivation layer 304 is formed over the light-emitting diodes 104 and the second structure 200. The passivation layer 304 also extends along sides of the contact pads 210 and conductive connectors 302. The passivation layer 304 may include a material such as silicon oxide, silicon nitride, aluminum oxide, aluminum nitride, the like, other materials, or a combination. The passivation layer 304 may be a single layer or include multiple layers. The passivation layer 304 may be formed using deposition processes such as CVD, PECVD, LPCVD, PVD, ALD, or the like. In some embodiments, the passivation layer 304 is formed having a thickness between about 0.1 µm and about 0.5 µm.

Still referring to FIG. 14, an isolation material 306 is formed over the passivation layer 304. The isolation material 306 may include a material such as silicon oxide, silicon nitride, aluminum oxide, aluminum nitride, a polymer, a polyimide or a polyimide derivative, the like, other materials, or a combination. The isolation material 306 may include a single layer or multiple layers. The isolation material 306 may be formed using deposition processes such as CVD, PECVD, LPCVD, PVD, ALD, a spin-coating process, or the like. After formation of the isolation material 306, the isolation material 306 may be planarized using, e.g., a CMP process. In some embodiments, after planarization, the isolation material 306 extends a height above the light-emitting diodes 104 that is between about 0.1 µm and about 6 µm.

Figure 15:
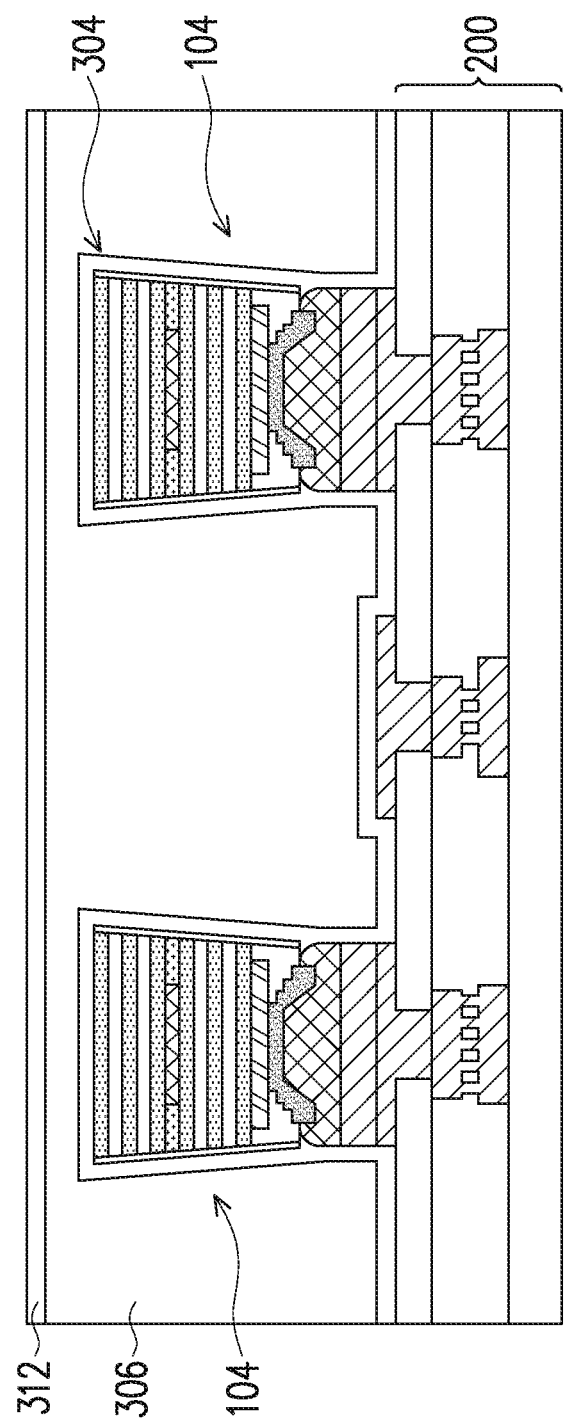

In FIG. 15, a mask layer 312 is formed on the isolation material 306. The mask layer 312 may be formed from a material such as SiC, or from a metal or a metal-containing material such as Ti, Cu, TiW, TaN, TiN, the like, or a combination. The mask layer 312 may be a single layer or may include multiple layers, and may be referred to as a hardmask layer. The mask layer 312 may be formed by a deposition process such as PVD, CVD, or the like.

Figure 16:
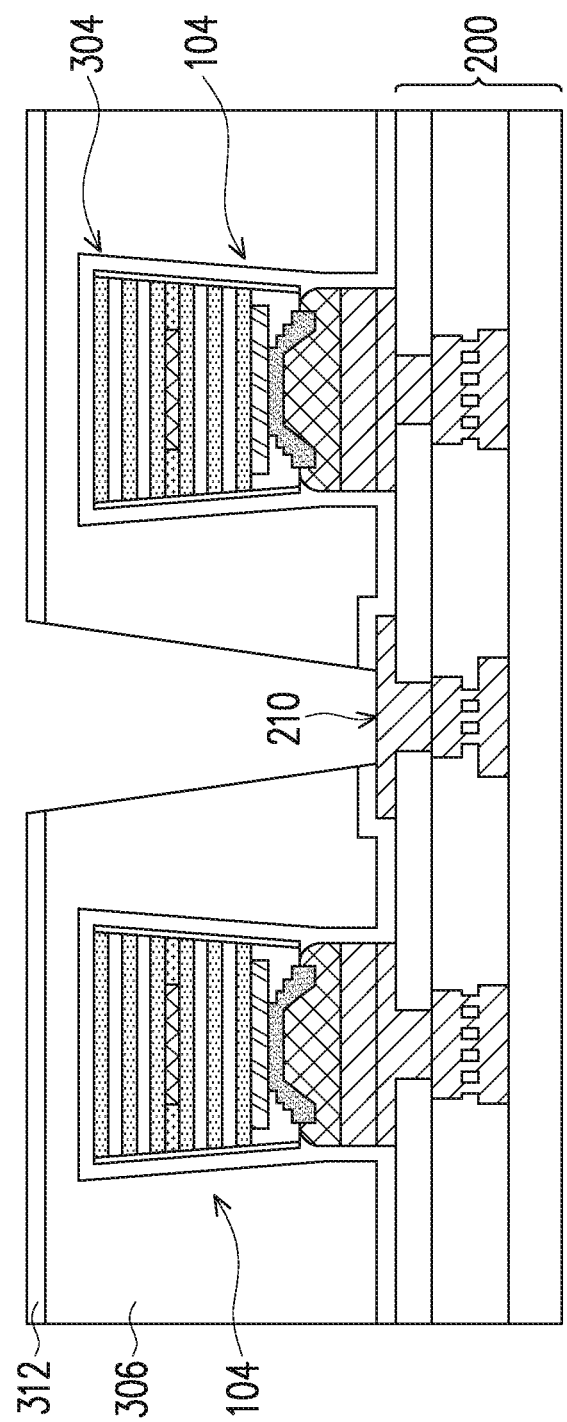

Turning to FIG. 16, openings are patterned in the isolation material 306, exposing one or more contact pads 210. The openings may be patterned using suitable photolithography and etching techniques. For example, a photoresist (not shown) may be formed on the mask layer 312. The photoresist may be a single-layer photoresist, a tri-layer photoresist, or the like, and may be formed by spin-coating or the like. The photoresist may be patterned by being exposed to light through a photomask and then developed, forming openings through the photoresist to expose regions of the mask layer 312. The pattern of the photoresist may be transferred to the mask layer 312 using the patterned photoresist as an etching mask. The mask layer 312 may be etched using an acceptable etching process, such as a wet etching process, a dry etching process, or a combination thereof.

The isolation material 306 may then be patterned by transferring the pattern of the mask layer 312 to the isolation material 306 using the patterned mask layer 312 as an etching mask. The isolation material 306 may be etched using an acceptable etching process, such as a wet etching process, a dry etching process, or a combination thereof. In some embodiments, the passivation layer 304 may be used as an etch stop for the etching of the isolation material 306, and etched using a separate etching process. Once patterning of the isolation material 306 is complete, remaining portions of the mask layer 312 and photoresist may be removed by a suitable process such as a wet etching process, a dry etching process, an ashing process, the like, or combinations thereof.

Figure 17:
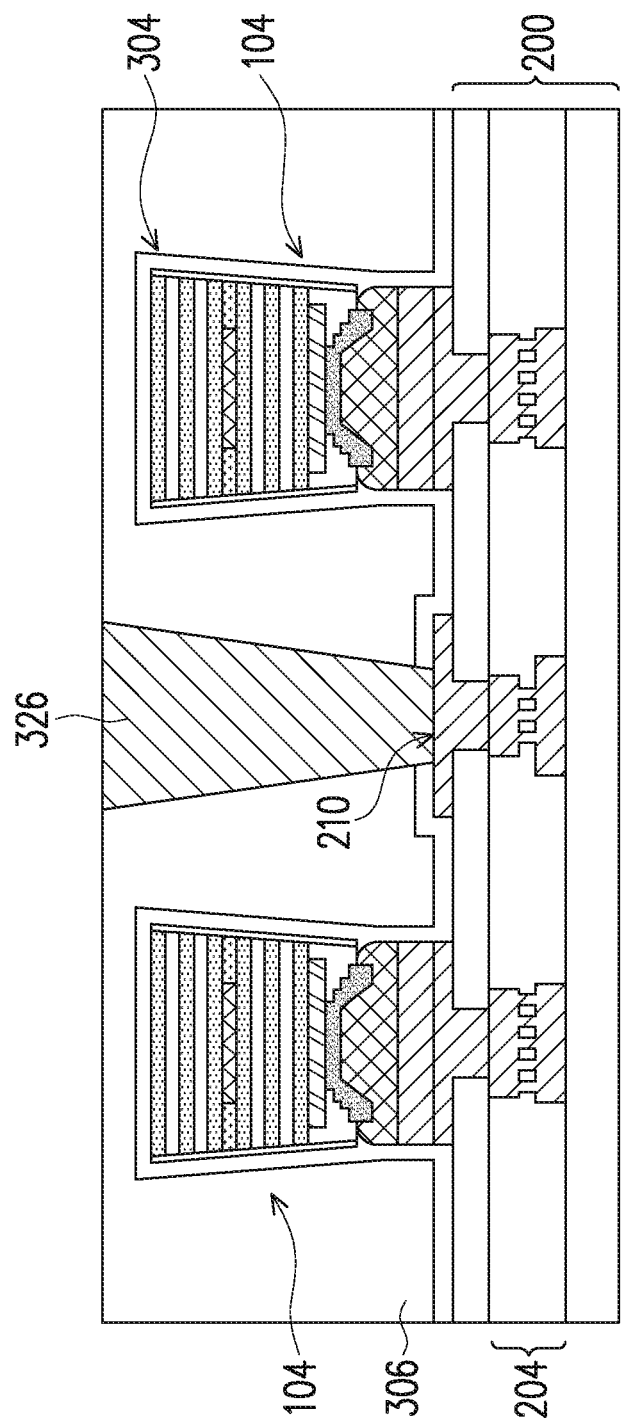

In FIG. 17, conductive material is formed in the openings of the isolation material 306 to form vias 326. In some embodiments, a barrier layer (not shown) may be first formed within the openings in the isolation material 306. The barrier layer may include a single layer or multiple layers, and may include Ti, Ta, TiN, TaN, the like, or a combination. A seed layer (not shown) may then be formed over the barrier layer. The seed layer may include a single layer or multiple layers, and may include Ti, Cu, the like, or a combination. The barrier layer or the seed layer may be formed using suitable processes such as CVD, PVD, or the like. The conductive material is then formed on the seed layer. The conductive material of the vias 326 may include a conductive material such as Cu, Ti, W, Al, the like, or a combination. The conductive material may be formed by plating, such as electroplating or electroless plating, or the like. After forming the conductive material, a planarization process is performed to planarize the conductive material and the isolation material 306, forming vias 326. The planarization process may be, e.g., a grinding process, a CMP process, or the like.

Figure 18:
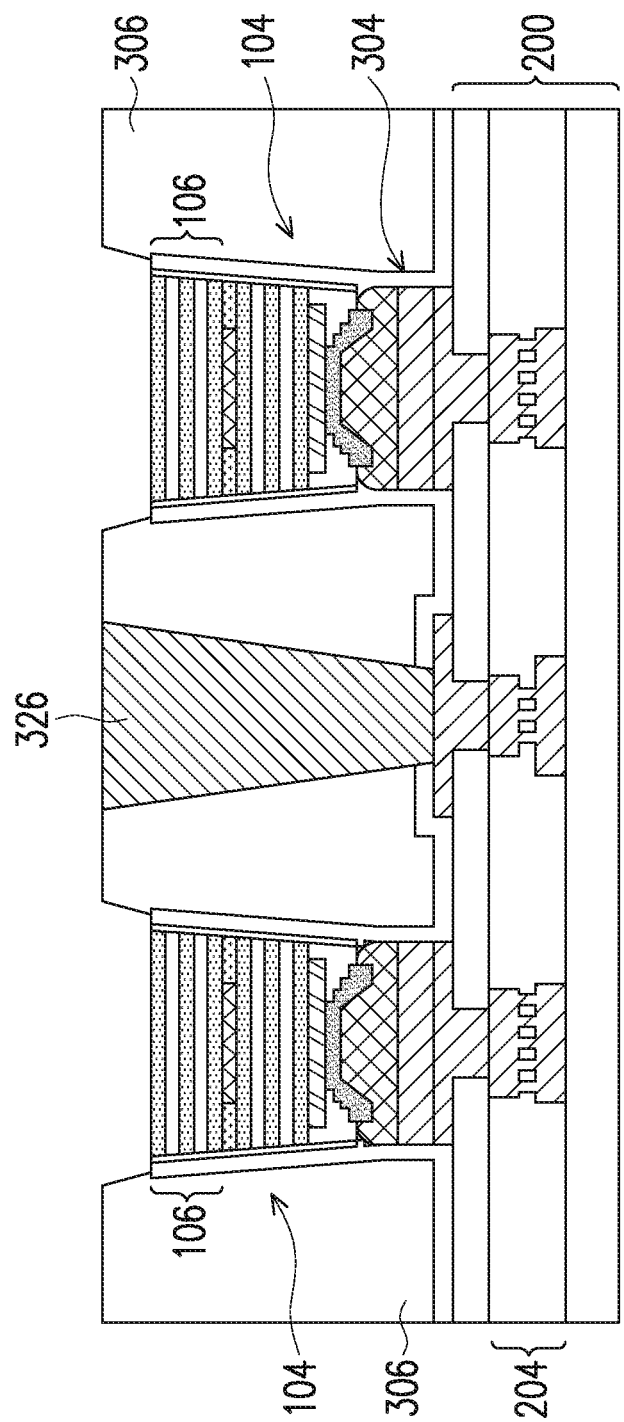

In FIG. 18, openings are formed in the isolation material 306, exposing surfaces of the first reflective structures 106 of the light-emitting diodes 104. In some embodiments, a photoresist (not shown) is formed on the isolation material 306 and vias 326. The photoresist may be a single-layer photoresist, a tri-layer photoresist, or the like, and may be formed by spin-coating or the like. The photoresist may be patterned by being exposed to light through a photomask and then developed, forming openings through the photoresist to expose regions of the isolation material 306. The isolation material 306 is then etched using the patterned photoresist as an etching mask. The isolation material 306 may be etched using an acceptable etching process, such as a wet etching process, a dry etching process, or a combination thereof. In some embodiments, the passivation layer 304 may be used as an etch stop for the etching of the isolation material 306, and etched using a separate etching process.

Figure 19:
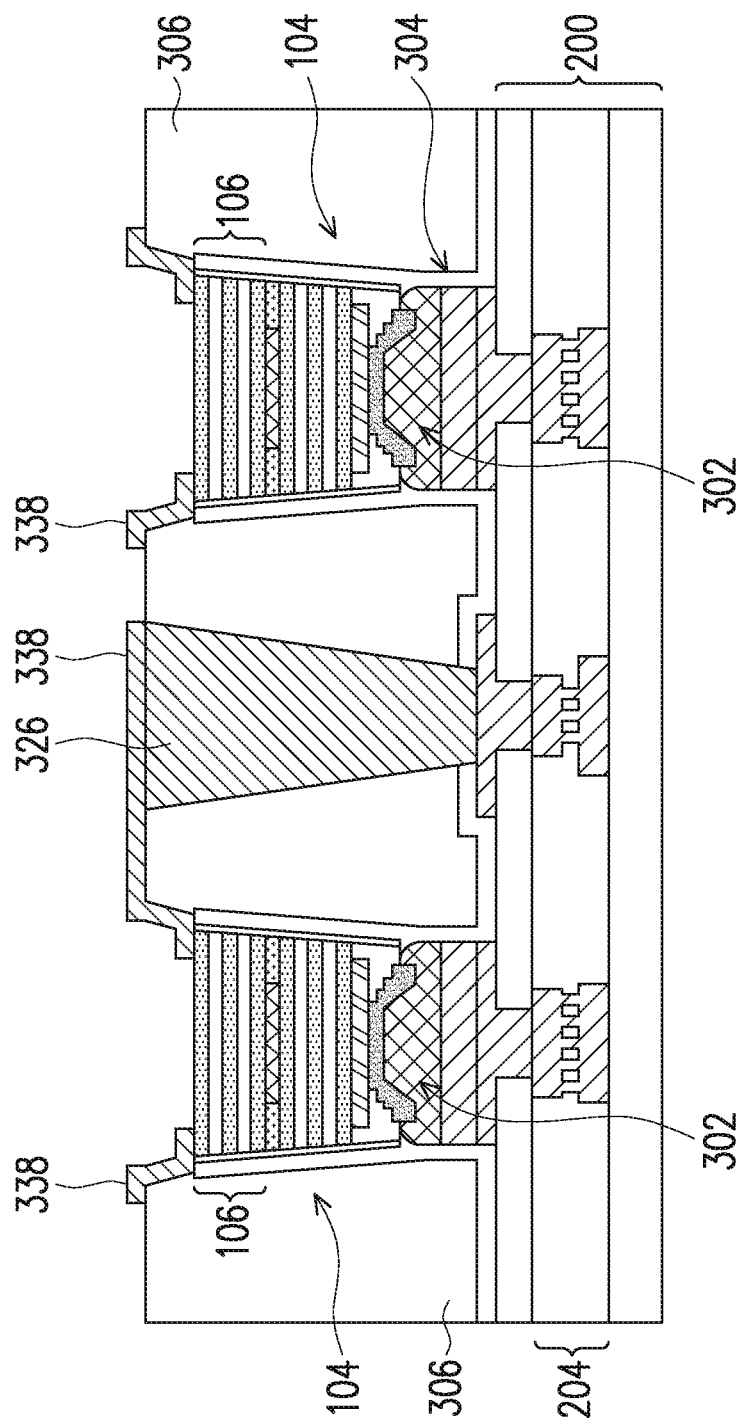

In FIG. 19, conductive lines 338 are formed in the openings in the isolation material 306, thereby forming contacts for the first reflective structures 106 of the light emitting diodes 104. In some embodiments, a seed layer (not shown) is first formed over the isolation material 306 and over the exposed surfaces of the first reflective surfaces 106 and vias 326. The seed layer may include a single layer or multiple layers, and may include Ti, Cu, the like, or a combination. The seed layer may be formed using a suitable process such as CVD, PVD, or the like. A photoresist (not shown) is then formed and patterned on the seed layer. The photoresist may be formed by spin-coating or the like and may be exposed to light for patterning. The photoresist may then be developed, forming openings through the photoresist to expose the seed layer. A conductive material is then formed in the openings of the photoresist and on the exposed portions of the seed layer. The conductive material may be formed by plating, such as electroplating or electroless plating, or the like. The conductive material of the conductive lines 338 may include conductive materials such as copper, titanium, tungsten, aluminum, platinum, nickel, gold, the like, or a combination. The conductive material may include a single layer or multiple layers. Then, the photoresist and portions of the seed layer on which the conductive material is not formed are removed using a suitable process, such as a dry etching process or an ashing process. After the photoresist is removed, exposed portions of the seed layer are removed using an acceptable etching process, such as by a wet or dry etching process. The remaining portions of the seed layer and conductive material form the conductive lines 338.

In addition to being contacts for the first reflective structures 106, the conductive lines 338 may also electrically connect some light-emitting diodes 104 to some vias 326, as shown in FIG. 19. In this manner, the interconnect structure 204 is electrically connected to the second reflective structures 110 through the conductive connectors 302, and the interconnect structure 204 is electrically connected to the first reflective structures 106 through the conductive lines 338 and vias 326.

Figure 20:
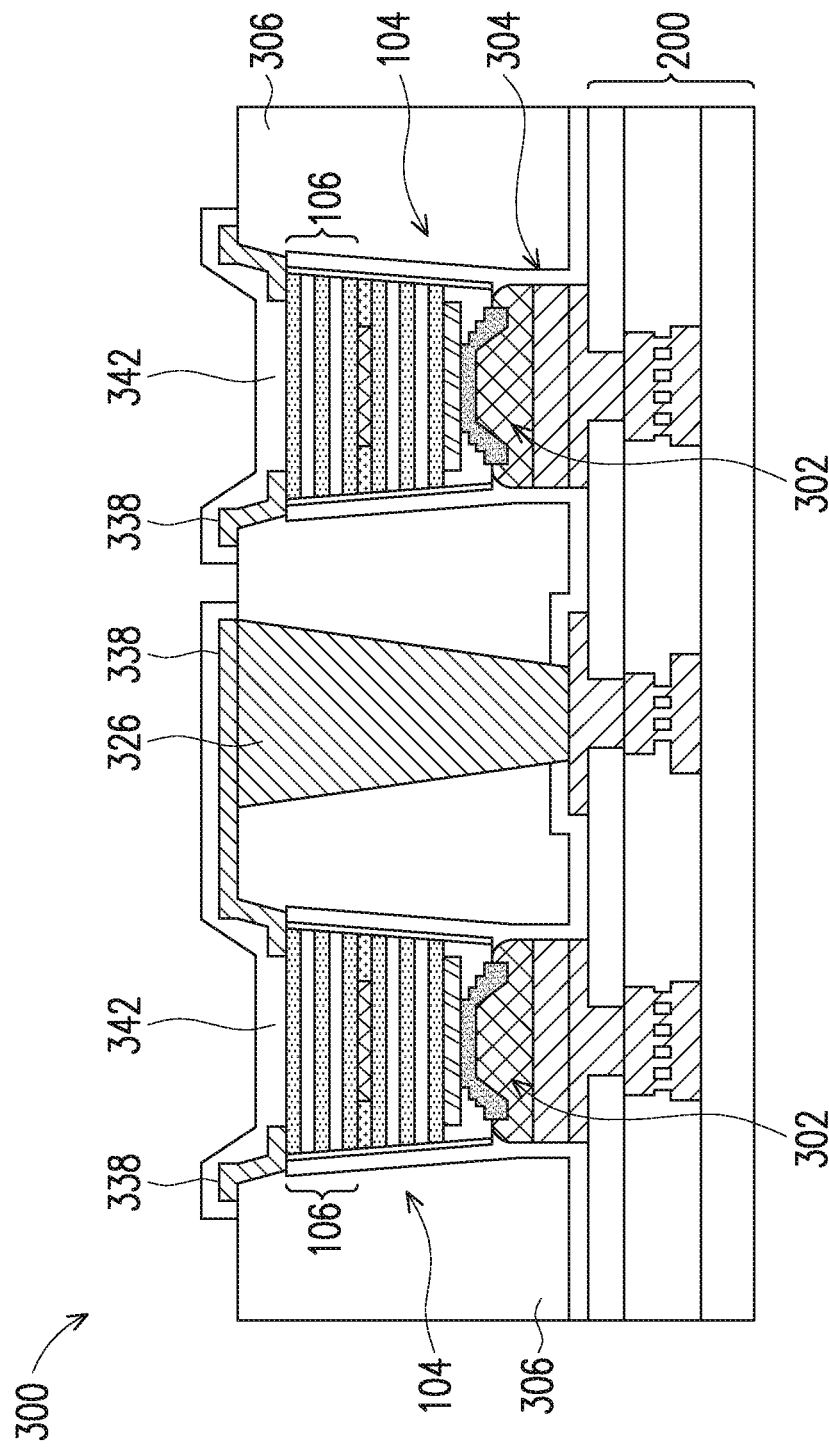

In FIG. 20, a passivation layer 342 is formed over the conductive lines 338 and isolation material 306. The passivation layer 342 may include silicon oxide, silicon nitride, the like, or a combination, and may be formed by a deposition process such as CVD. In some embodiments, the passivation layer 342 is patterned after formation, as shown in FIG. 20. After patterning, remaining portions of the passivation layer 342 may cover the conductive lines 338 and vias 326. The passivation layer 342 may be patterned using photolithographic techniques, such as forming a photoresist, patterning the photoresist, and etching the passivation layer 342 using the patterned photoresist as an etching mask. The passivation layer 342 may be etching using a suitable process, such as a wet etching process or a dry etching process.

Embodiments may achieve advantages. By forming two separate photoresists during the formation of the recesses in the hard mask regions of the light-emitting diodes (e.g., similar to FIGS. 6A-9F), improved development of the photoresist over the hard mask regions can be achieved. In some cases, the use of two photoresists allows for increased ranges of mesa pitches, heights, and widths. For example, a pitch between adjacent mesas as large as about 60 μm may be used with less chance of photoresist development problems, such as all of the photoresist over the hard mask regions being removed during development. In some cases, an aspect ratio (height/width) of the gap between adjacent mesas as low as about 0.3 may be used with less chance of photoresist development problems. In this manner, forming two separate photoresists as described herein may allow for greater flexibility in the arrangement, spacing, dimensions, or design of devices such as light-emitting diodes, laser diodes, the photonic devices described herein, or in other types of devices.

Forming recesses in the hard mask regions using multiple etch and trim steps (e.g., similar to FIGS. 6F-J) also may achieve advantages. By forming the recesses in this manner, the recesses may have stepped sidewalls. The stepped sidewalls of the recesses allow for bonding pads of the mesas to be formed having angled sidewalls. The angled sidewalls of the bonding pads may allow for improved solder contact. For example, the solder may be able to contact more surface area of bonding pads with angled sidewalls than bonding pads with more vertical sidewalls. In some cases, the formation of voids in solder may be less likely using the techniques described herein. In this manner, the electrical performance of the device may be improved. In some cases, the use of two separate photoresists as described above may more easily enable the hard mask regions to be etched having stepped sidewalls. For example, patterning the photoresists over the hard mask to have angled sidewalls may allow for the formation of larger steps in the stepped sidewalls of the hard mask regions.

In an embodiment, a method includes depositing a photonic structure over a substrate, the photonic structure including photonic semiconductor layer, forming conductive pads over the photonic structure, forming a hard mask over the conductive pads, wherein the hard mask is patterned to cover each conductive pad with a hard mask region, etching the photonic structure using the hard mask as an etching mask to form multiple mesa structures protruding from the substrate, each mesa structure including a portion of the photonic structure, a contact pad, and a hard mask region, depositing a first photoresist over the multiple mesa structures, depositing a second photoresist over the first photoresist, patterning the second photoresist to expose the hard mask regions of the multiple mesa structures, and etching the hard mask regions to expose portions of the contact pads of the multiple mesa structures. In an embodiment, the second photoresist is a positive photoresist. In an embodiment, the first photoresist is a different type of photoresist than the second photoresist. In an embodiment, the method further includes, after depositing the first photoresist and prior to depositing the second photoresist, patterning the first photoresist to expose the hard mask regions of the multiple mesa structures. In an embodiment, depositing the photonic structure includes depositing first doped layers of a semiconductor material over the substrate, depositing an emitting semiconductor region over the first doped layers, and depositing second doped layers of the semiconductor material over the emitting semiconductor region. In an embodiment, wherein etching the hard mask regions includes performing a first dry etching process to partially etch the hard mask regions and performing one or more etching cycles, wherein each etching cycle includes performing a trim process to partially etch the second photoresist and performing a second dry etching process to partially etch the hard mask regions. In an embodiment, the trim process includes a first plasma etching process using O2 as a process gas, and wherein the second dry etching process includes a second plasma etching process using CH4 and CHF3 as process gases. In an embodiment, after etching the hard mask regions, portions of the hard mask regions have stepped surfaces. In an embodiment, the method further includes forming bonding pads over the exposed portions of the contact pads, the bonding pads extending over the hard mask regions. In an embodiment, the method further includes attaching an interconnect structure to the bonding pads of multiple mesa structures, wherein the interconnect structure includes multiple contact structures, wherein the attaching includes forming solder bumps on the multiple contact structures of the interconnect structure, and contacting each solder bump of the interconnect structure to a corresponding bonding pad of one of the multiple mesa structures.

In an embodiment, a method includes forming multiple light-emitting structures on a carrier substrate, each light-emitting structure including first multiple reflection layers disposed over the carrier substrate, a light-emitting semiconductor layer disposed over the first multiple reflection layers, second multiple reflection layers disposed over the light-emitting semiconductor layer, a conductive pad disposed over the second multiple reflection layers, and a dielectric layer disposed over the conductive pad. The method also includes forming a first photoresist material over the carrier substrate between adjacent light-emitting structures, forming a second photoresist material over the first photoresist material and over the multiple light-emitting structures, patterning openings in the second photoresist material to expose the dielectric layer of each light-emitting structure, etching a recess in the dielectric layer of each light-emitting structure, the recess exposing the conductive pad of the light-emitting structure, wherein the recess has stepped sidewalls, and forming a bonding pad in the recess in the dielectric layer of each light-emitting structure, the bonding pad extending over the respective conductive pad of the light-emitting structure and over the sidewalls of the recess. In an embodiment, the first photoresist material includes a negative photoresist. In an embodiment, the second photoresist material includes a positive photoresist. In an embodiment, after forming the second photoresist material, the first photoresist material is interposed between the second photoresist material and the dielectric layer. In an embodiment, the stepped sidewalls of the recess make an angle with a top surface of the conductive pad that is between 45° and 70°. In an embodiment, forming the plurality of light-emitting structures further includes forming protective spacers on exposed sidewalls of the first plurality of reflection layers, the second plurality of reflection layers, and the dielectric layer. In an embodiment, the method further includes, after etching the recess in the dielectric layer of each light-emitting structure, removing the first photoresist material and the second photoresist material, wherein the protective spacers have rough surfaces after removing the first photoresist material and the second photoresist material.

In an embodiment, a device includes multiple light-emitting diode structures, wherein each of the light-emitting diode structures includes a first multi-layer reflection structure, a second multi-layer reflection structure, a light-emitting diode layer disposed between the first multi-layer reflection structure and the second multi-layer reflection structure, an insulating layer over the second multi-layer reflection structure, and a bonding structure extending through the insulating layer and making electrical connection to the second multi-layer reflection structure, the bonding structure having stepped sidewalls. The device also includes an interconnect structure including multiple contact pads, wherein the bonding structure of each one of the multiple light-emitting diode structures is electrically connected to a respective contact pad of the interconnect structure by a solder material, wherein the solder material physically contacts the non-vertical interior sidewalls of the respective bonding structure. In an embodiment, the exterior sidewalls of the bonding structure have a stepped profile. In an embodiment, wherein the light-emitting diode structures have a pitch between 20 μm and 60 μm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a photonic structure over a substrate, the photonic structure comprising a photonic semiconductor layer;
   forming conductive pads over the photonic structure;
   forming a hard mask over the conductive pads, wherein the hard mask is patterned to cover each conductive pad with a hard mask region;
   etching the photonic structure using the hard mask as an etching mask to form a plurality of mesa structures protruding from the substrate, each mesa structure comprising a portion of the photonic structure, a contact pad, and a hard mask region;
   depositing a first photoresist over the plurality of mesa structures;
   patterning the first photoresist;
   depositing a second photoresist over the patterned first photoresist;
   patterning the second photoresist to expose the hard mask regions of the plurality of mesa structures; and
   etching the hard mask regions to expose portions of the contact pads of the plurality of the mesa structures.

2. The method of claim 1, wherein the second photoresist is a positive photoresist.

3. The method of claim 1, wherein the first photoresist is a different type of photoresist than the second photoresist.

4. The method of claim 1, wherein patterning the first photoresist exposes the hard mask regions of the plurality of the mesa structures.

5. The method of claim 1, wherein depositing the photonic structure comprises:
   depositing first doped layers of a semiconductor material over the substrate;
   depositing an emitting semiconductor region over the first doped layers; and
   depositing second doped layers of the semiconductor material over the emitting semiconductor region.

6. The method of claim 1, wherein etching the hard mask regions comprises:
   performing a first dry etching process to partially etch the hard mask regions; and
   performing one or more etching cycles, wherein each etching cycle comprises:
     performing a trim process to partially etch the second photoresist; and
     performing a second dry etching process to partially etch the hard mask regions.

7. The method of claim 6, wherein the trim process comprises a first plasma etching process using $O_2$ as a process gas, and wherein the second dry etching process comprises a second plasma etching process using $CH_4$ and $CHF_3$ as process gases.

8. The method of claim 1, wherein after etching the hard mask regions, portions of the hard mask regions have stepped surfaces.

9. The method of claim 1, further comprising, after etching the hard mask regions, forming bonding pads over the exposed portions of the contact pads, the bonding pads extending over the remaining hard mask regions.

10. The method of claim 9, further comprising attaching an interconnect structure to the bonding pads of the plurality of mesa structures, wherein the interconnect structure comprises a plurality of contact structures, wherein the attaching comprises:
    forming solder bumps on the plurality of contact structures of the interconnect structure; and
    contacting each solder bump of the interconnect structure to a corresponding bonding pad of one of the plurality of mesa structures.

11. A method comprising:
    forming a plurality of light-emitting structures on a carrier substrate, each light-emitting structure comprising:
      a first reflective structure comprising a first plurality of layers disposed over the carrier substrate;
      a light-emitting semiconductor layer disposed over the first plurality of layers;
      a second reflective structure comprising a second plurality of layers disposed over the light-emitting semiconductor layer;
      a conductive pad disposed over the second plurality of layers; and
      a dielectric layer disposed over the conductive pad;
    forming a first photoresist material over the carrier substrate between adjacent light-emitting structures;
    forming a second photoresist material over the first photoresist material and over the plurality of light-emitting structures;
    patterning openings in the second photoresist material to expose the dielectric layer of each light-emitting structure;
    etching a recess in the dielectric layer of each light-emitting structure, the recess exposing the conductive pad of the light-emitting structure, wherein the recess has stepped sidewalls; and
    forming a bonding pad in the recess in the dielectric layer of each light-emitting structure, the bonding pad extending over the respective conductive pad of the light-emitting structure and over the sidewalls of the recess.

12. The method of claim 11, wherein the first photoresist material comprises a negative photoresist.

13. The method of claim 11, wherein the second photoresist material comprises a positive photoresist.

14. The method of claim 11, wherein, after forming the second photoresist material, a portion of the first photoresist material extending over a corresponding second reflective structure is interposed between the second photoresist material and a corresponding dielectric layer.

15. The method of claim 11, wherein each of the stepped sidewalls of the recess makes an angle with a top surface of the conductive pad that is between 45 and 70°.

16. The method of claim 11, wherein forming the plurality of light-emitting structures further comprises forming protective spacers on exposed sidewalls of the first plurality of layers, the second plurality of layers, and the dielectric layer.

17. The method of claim 16, further comprising, after etching the recess in the dielectric layer of each light-emitting structure, removing the first photoresist material and the second photoresist material, wherein the protective spacers have rough surfaces after removing the first photoresist material and the second photoresist material.

18. A method comprising:
forming a first photonic structure and a second photonic structure on a substrate, wherein the first photonic structure comprises a first reflective structure, a first conductive layer over the first reflective structure, and a first dielectric layer over the first conductive layer, and wherein the second photonic structure comprises a second reflective structure, a second conductively layer over the second reflective structure, and a second dielectric layer over the second conductive layer;
depositing a first photoresist between the first photonic structure and the second photonic structure;
depositing a second photoresist over the first photonic structure, the second photonic structure, and the first photoresist;
patterning the second photoresist;
using the patterned second photoresist as an etching mask, etching the first dielectric layer and the second dielectric layer to expose the first conductive layer and the second conductive layer;
forming a first bonding structure on the first conductive layer and a second bonding structure on the second conductive layer; and
bonding an interconnect structure to the first bonding structure and to the second bonding structure, comprising bonding a first contact pad of the interconnect structure to the first bonding structure and bonding a second contact pad of the interconnect structure to the second bonding structure.

19. The method of claim 18, wherein etching the first dielectric layer and the second dielectric layer forms a first stepped opening in the first dielectric layer and a second stepped opening in the second dielectric layer.

20. The method of claim 18, wherein the first photoresist and the second photoresist are different types of photoresist.

* * * * *

UNITED STATES PATENT AND TRADEMARK OFFICE
CERTIFICATE OF CORRECTION

PATENT NO. : 11,121,299 B2  
APPLICATION NO. : 16/564153  
DATED : September 14, 2021  
INVENTOR(S) : Tian Hu Page 1 of 1

It is certified that error appears in the above-identified patent and that said Letters Patent is hereby corrected as shown below:

In the Claims

Column 24, Claim 15, Line 63; delete "45" and insert --45°--.

Signed and Sealed this  
Nineteenth Day of October, 2021

Drew Hirshfeld  
*Performing the Functions and Duties of the*  
*Under Secretary of Commerce for Intellectual Property and*  
*Director of the United States Patent and Trademark Office*